(12) United States Patent
Sedlmaier et al.

(10) Patent No.: US 7,554,137 B2
(45) Date of Patent: Jun. 30, 2009

(54) POWER SEMICONDUCTOR COMPONENT WITH CHARGE COMPENSATION STRUCTURE AND METHOD FOR THE FABRICATION THEREOF

(75) Inventors: Stefan Sedlmaier, München (DE); Hans-Joachim Schulze, Ottobrunn (DE); Anton Mauder, Kolbermoor (DE); Helmut Strack, München (DE); Armin Willmeroth, Augsburg (DE); Frank Pfirsch, München (DE)

(73) Assignee: Infineon Technologies Austria AG, Villach (AT)

( * ) Notice: Subject to any disclaimer, the term of this patent is extended or adjusted under 35 U.S.C. 154(b) by 58 days.

(21) Appl. No.: 11/552,804

(22) Filed: Oct. 25, 2006

(65) Prior Publication Data

US 2007/0108512 A1     May 17, 2007

Related U.S. Application Data

(60) Provisional application No. 60/729,856, filed on Oct. 25, 2005.

(51) Int. Cl.
*H01L 29/732* (2006.01)
*H01L 29/423* (2006.01)
(52) U.S. Cl. .................. 257/263; 257/328; 257/329; 257/E29.183; 257/E29.131
(58) Field of Classification Search ............... 257/328, 257/329, 263, E29.183, E29.131
See application file for complete search history.

(56) References Cited

U.S. PATENT DOCUMENTS

| | | | |
|---|---|---|---|
| 6,326,656 B1 | 12/2001 | Tihanyi | ............... 257/288 |
| 6,406,982 B2 | 6/2002 | Urakami et al. | ............... 438/492 |
| 6,495,294 B1 | 12/2002 | Yamauchi et al. | ............ 429/597 |
| 6,521,954 B1 | 2/2003 | Kouzuki et al. | |
| 6,608,350 B2 | 8/2003 | Kinzer et al. | ............... 257/341 |
| 6,838,729 B2 | 1/2005 | Schlögl et al. | ............... 257/328 |
| 2003/0011039 A1 | 1/2003 | Ahlers et al. | ................ 257/493 |

(Continued)

FOREIGN PATENT DOCUMENTS

DE     19828191     7/1999

(Continued)

OTHER PUBLICATIONS

Dutartre D. et al. "Si/SiGe(C) Epitaxy by RTCVD for Advanced Electonics", pp. 209-214, Jun. 10, 2005.

(Continued)

*Primary Examiner*—Victor A Mandala
(74) *Attorney, Agent, or Firm*—Eschweiler & Associates, LLC

(57) ABSTRACT

A semiconductor component (1) with charge compensation structure (3) has a semiconductor body (4) having a drift path (5) between two electrodes (6, 7). The drift path (5) has drift zones of a first conduction type, which provide a current path between the electrodes (6, 7) in the drift path, while charge compensation zones (11) of a complementary conduction type constrict the current path of the drift path (5). For this purpose, the drift path (5) has two alternately arranged, epitaxially grown diffusion zone types (9, 10), the first drift zone type (9) having monocrystalline semiconductor material on a monocrystalline substrate (12), and a second drift zone type (10) having monocrystalline semiconductor material in a trench structure (13), with complementarily doped walls (14, 15), the complementarily doped walls (14, 15) forming the charge compensation zones (11).

29 Claims, 14 Drawing Sheets

U.S. PATENT DOCUMENTS

2004/0084724 A1* 5/2004 Kapels et al. .............. 257/330
2005/0006699 A1 1/2005 Sato et al.

FOREIGN PATENT DOCUMENTS

DE 10120656 10/2002
DE 10132136 2/2003
DE 102 45 049 A1 4/2004
WO WO 01/45155 A1 6/2001

OTHER PUBLICATIONS

Chang et al., "Selective Etching of SiGe/Si Heterostructures", The Electrochemical Society, Inc., J. Electrochem Soc., vol. 138, No. 1, pp. 202-204, Jan. 1991.

* cited by examiner

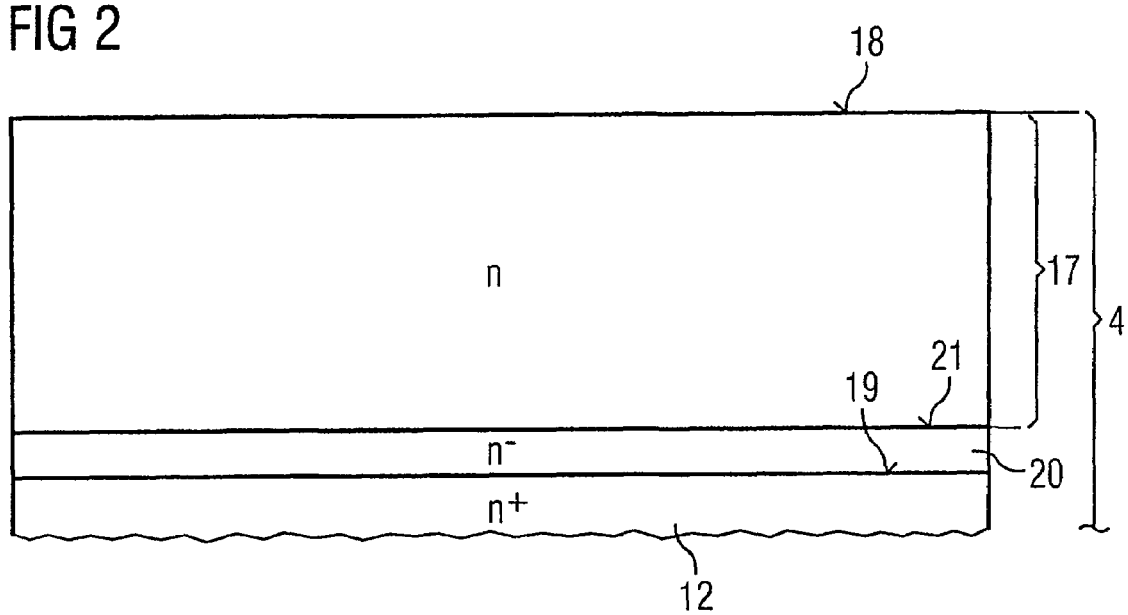
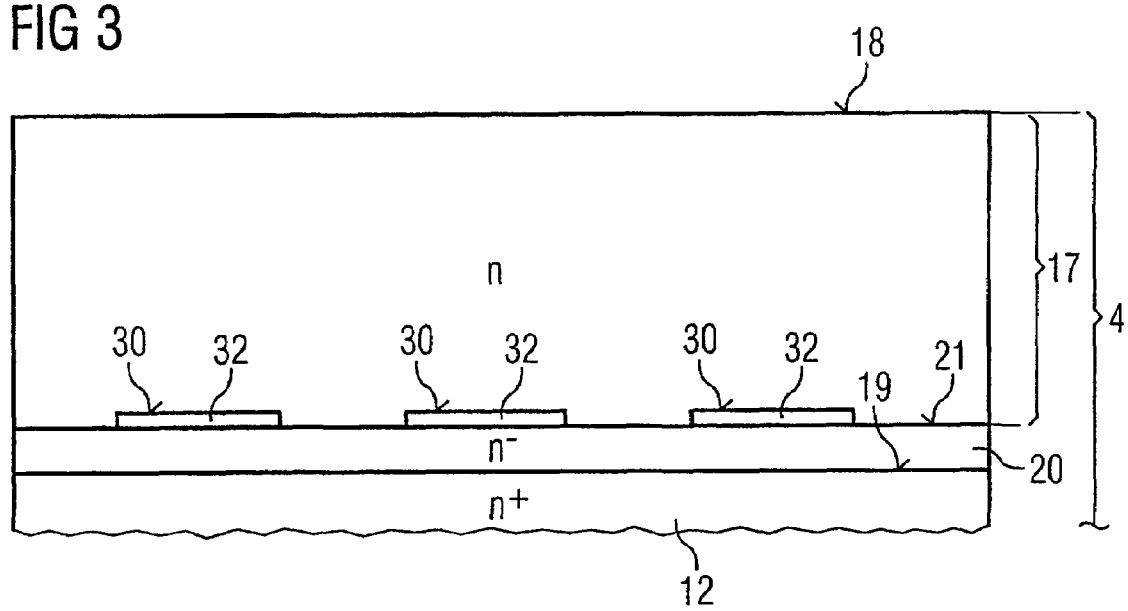

US 7,554,137 B2

POWER SEMICONDUCTOR COMPONENT WITH CHARGE COMPENSATION STRUCTURE AND METHOD FOR THE FABRICATION THEREOF

CROSS-REFERENCE TO RELATED APPLICATIONS

This application claims the benefit of U.S. Provisional Application No. 60/729,856 filed on Oct. 25, 2005, entitled "LEISTUNGSHALBLEITERBAUELEMENT MIT LADUNGSKOMPENSATIONSSTRUKTUR UND VERFAHREN ZUR HERSTELLUNG DESSELBEN," which is incorporated herein in its entirety.

TECHNICAL FIELD

The invention relates to a semiconductor component with charge compensation structure and a method for the fabrication thereof. The semiconductor component has, in a semiconductor body, a drift path between two electrodes. In this case, the drift path has drift zones of a first conduction type, which provide a current path between the electrodes in the drift path. Moreover, the drift path has charge compensation zones of a complementary conduction type, which constrict the current path of the drift path.

BACKGROUND

Such a semiconductor component with charge compensation structure and an associated fabrication method is disclosed in DE 101 32 136 C1. The charge compensation structure of this semiconductor component has, in cross section, a plurality of complementarily conducting regions which are stacked one on top of another and produce, through an alternation of successive epitaxy steps with selective ion implantation, a plurality of delimited sources of a dopant for the complementary conduction type stacked one on top of another. Vertical and lateral diffusion of the sources results in the formation of contiguous charge compensation zones of the complementary conduction type in the drift path of the semiconductor component.

Such a charge compensation structure has the disadvantage that the defect sources have to be applied in areal fashion through corresponding ion implantation masks, and thus cannot be arbitrarily reduced in terms of their lateral extent from a production engineering standpoint. What is more, said lateral extent is also increased after the selective ion implantation by virtue of the subsequent diffusion. The semiconductor body material required for such a charge compensation structure is no longer available for the current path of the drift path. On account of the photolithographic implantation masks, the lateral limits of the cross section of the known charge compensation structure require minimum sizes in the micron range and tolerances significantly in the submicron range. A further disadvantage is that the fabrication of such charge compensation zones necessitates a plurality of epitaxy steps, alignment steps, photolithographic masking steps and ion implantation steps, and also finally at least one diffusion step, which leads to a cost-intensive production method for such semiconductor components.

An alternative lateral semiconductor component is disclosed in the patent specification DE 198 28 191 C1 in which a trench structure is introduced into the epitaxial layer of the drift path instead of diffused charge compensation zones. Charge compensation zones with a complementary conduction type are subsequently indiffused into the walls and into the bottom of the trench structure, in which case, as source material of the dopant for the complementary conduction type, the trench structure is either filled with a highly doped polysilicon, or a doping glass is applied into the trench structure on the sidewalls and the bottom. Although the width of the active compensation zone is reduced at least in the edge regions by means of this method, the volume of the trench structure is not available for the current path between the two electrodes of the semiconductor component, so that, in this case, too, a considerable proportion of the epitaxial area has to be sacrificed for introducing the charge compensation structure in the drift path.

The document U.S. Pat. No. 6,608,350 B2 furthermore discloses a high-voltage-resistant vertically conducting semiconductor component having a multiplicity of deep trenches or holes in a weakly doped drift path. In one exemplary embodiment, in this case, too, the trench structures are filled by a semiconducting polysilicon body, but the complementarily conducting wall doping is no longer arranged in the bottom region of the trench structure, so that the polycrystalline, semiconducting silicon in the bottom region is in contact with the material of the drift path. Consequently, the polycrystalline silicon supplies a high-resistance current path between the two electrodes, thereby intensifying the influencing of the field distribution in the drift zones which proceeds from the charge compensation zones of the complementarily conducting walls of the trench structure. This solution nevertheless constitutes a disadvantage for the semiconductor components because the volume of the trench structure again makes no contribution to the current path of the drift zones.

Finally, the document U.S. Pat. No. 6,495,294 B1 discloses a method for fabricating a semiconductor substrate having an epitaxial film in a trench structure. For this purpose, a first epitaxial layer of a first conduction type is applied on a monocrystalline semiconductor wafer and a trench structure is etched into the epitaxial layer. In two stages, the trench structure is then filled with semiconducting monocrystalline material of a complementary conduction type with respect to the first conduction type to form charge compensation zones. In a first stage, an amorphous noncrystalline complementarily doped layer is deposited in the trench structure, which is subsequently subjected to heat treatment to form a monocrystalline complementarily doped seed layer. Afterward, in a second stage, a complementarily doped monocrystalline filling of the trench structure is grown on the monocrystalline seed layer. With this monocrystalline filling of the trench structure, a compensation zone that is defined exactly in terms of its width is available, which compensation zone occupies a considerable proportion of a drift path of a semiconductor component and thus disadvantageously constricts and reduces the epitaxial material of the first conduction type for the formation of current paths in drift zones. The semiconductor components mentioned above can be power semiconductor components.

SUMMARY

In one embodiment, in a semiconductor component, on the one hand, the plurality of grown epitaxial layers is reduced and, on the other hand, the volume of trench structures can be utilized for the current paths of the drift paths in a semiconductor component. In an embodiment, the semiconductor component charge compensation zones can be reduced to a minimum in terms of their extent. Thus, in one embodiment, a semiconductor component with charge compensation structure may comprise, in a semiconductor body, a drift path between two electrodes, and the drift path having drift zones of a first conduction type, which provide a current path between the electrodes in the drift path, and charge compensation zones of a complementary conduction type, which constrict the current path of the drift path, the drift zones having two alternately arranged, epitaxially grown drift zone types of the first conduction type, a first drift zone type having monocrystalline semiconductor material on a monocrystalline substrate and a second drift zone type having monocrystalline semiconductor material in a trench structure with complementarily doped walls, the complementarily doped walls forming the charge compensation zones.

BRIEF DESCRIPTION OF THE DRAWINGS

The invention will now be explained in more detail with reference to the accompanying figures.

FIGS. 2 to 12 show schematic diagrams relating to individual method steps during the fabrication of the power semiconductor component in accordance with FIG. 1;

FIG. 2 shows a schematic cross section through a highly doped substrate after application of a pedestal epitaxial layer and an epitaxial layer for a first drift zone type;

FIG. 3 shows a schematic cross section through a highly doped substrate after application of a pedestal epitaxial layer and a patterned auxiliary layer;

FIG. 4 shows a schematic cross section through the highly doped substrate in accordance with FIG. 2, after introduction of a trench structure into the epitaxial layer;

FIG. 5 shows a schematic cross section through the highly doped substrate in accordance with FIG. 4 after growth of a complementarily relatively highly doped monocrystalline epitaxial layer on the top sides of the trench structure;

FIG. 6 shows a scheme for the fabrication of a second drift zone type made from monocrystalline semiconductor material in a trench structure with complementarily doped trench structure walls, which form charge compensation zones, with three variants for the fabrication of complementarily doped trench structure walls;

FIG. 7 shows a schematic cross section through the substrate in accordance with FIG. 5, after etching free the bottom region of the trench structure and the top side of the first drift zone types that are in mesa form;

FIG. 8 shows a schematic cross section through the substrate in accordance with FIG. 7, after growth of a monocrystalline semiconductor material in the trench structures for a second drift zone type;

FIG. 9 shows a schematic cross section through the substrate in accordance with FIG. 8, after leveling of the top side of the semiconductor body by means of a photoresist layer;

FIG. 10 shows a schematic cross section through the substrate in accordance with FIG. 9, after etching-back of the top side of the semiconductor body;

FIG. 11 shows a schematic cross section through the substrate with a variant of the semiconductor body and etching-back of the top side;

FIG. 12 shows a schematic cross section through a power semiconductor component in accordance with FIG. 1;

FIG. 13 shows a schematic cross section through a highly doped substrate after application of an epitaxial layer for a first drift cell type;

FIG. 14 shows a schematic cross section through the substrate in accordance with FIG. 13, after introduction of a trench structure and application of a highly doped, complementarily conducting layer in the trench structure walls for charge compensation zones;

FIG. 15 shows a schematic cross section through the substrate in accordance with FIG. 14, after application of a diffusion-inhibiting layer in the trench structure;

FIG. 16 shows a schematic cross section through the substrate in accordance with FIG. 15, after application of an end point control layer on the top sides of the mesas and uncovering of the trench bottom;

FIG. 17 shows a schematic cross section through the substrate in accordance with FIG. 16, after growth of a monocrystalline semiconductor material in the trench structure for a second drift zone type;

FIG. 18 shows a schematic cross section through the substrate in accordance with FIG. 17, after etching-back of the top side of the semiconductor body;

FIG. 19 shows a schematic cross section through a power semiconductor component in accordance with a second embodiment.

FIGS. 20 to 26 show schematic cross sections through the edge region of a power semiconductor component during the fabrication of an edge structure;

FIG. 20 shows a schematic cross section through the edge region of the power semiconductor component with substrate, pedestal epitaxial layer and epitaxial layer;

FIG. 21 shows a schematic cross section through the edge region in accordance with FIG. 20, after introduction of a trench structure with an edge trench;

FIG. 22 shows a schematic cross section through the edge region in accordance with FIG. 21, after introduction of a complementarily conducting layer and a diffusion-inhibiting layer on the trench walls;

FIG. 23 shows a schematic cross section through the edge region of FIG. 22, after filling the trench structure with monocrystalline semiconductor material for a second drift zone type and for an edge structure;

FIG. 24 shows a schematic cross section through the edge region in accordance with FIG. 23, after etching back the top side of the semiconductor body and uncovering an edge contour;

FIG. 25 shows a schematic cross section through the edge region in accordance with FIG. 24, after application of an edge passivation layer;

FIG. 26 shows a schematic cross section through an alternative edge structure.

DETAILED DESCRIPTION

Figure 1:
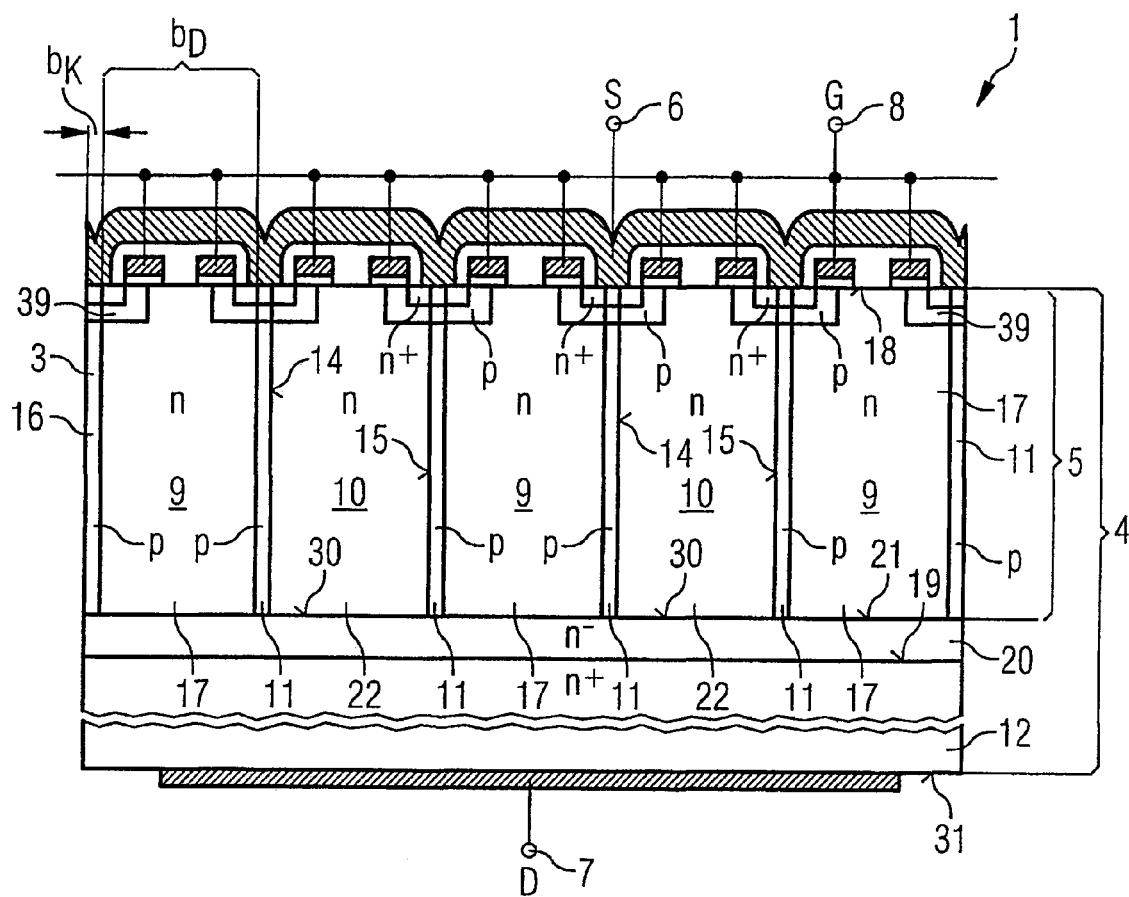
FIG. 1 shows a schematic cross section through a power semiconductor component, in accordance with a first embodiment.

In one embodiment, a semiconductor component comprises a charge compensation structure and in another embodiment a method for fabricating it, the semiconductor component having, in a semiconductor body, a drift path between two electrodes. The drift path may comprise drift zones of a first conduction type, which provide a current path between the electrodes in the drift path. The charge compensation zones may have a complementary conduction type and constrict the current path of the drift path. For this purpose, the drift zones have two alternately arranged, epitaxially grown drift zone types of the first conduction type. A first drift zone type may have a monocrystalline semiconductor material grown on a monocrystalline substrate. A second drift zone type may have a monocrystalline semiconductor material in a trench structure having complementarily doped walls, the complementarily doped walls forming the charge compensation zones.

This semiconductor component has the advantage that the current path within the drift path between the electrodes is significantly enlarged since now, through the second drift zone type, the volume of the trench structure which is filled with monocrystalline semiconductor material also contributes to the carrying of current between the electrodes. The forward resistance of the semiconductor component is thus advantageously reduced, without impairing the blocking properties of the semiconductor component with charge compensation structure.

In one embodiment, the ratio v between the width $b_K$ of the charge compensation zones transversely with respect to the current path and the width $b_D$ of the drift zones transversely with respect to the current path is $b_K/b_D = v \leq 0.1$. Given a drift zone width of 10 μm, charge compensation zones thus require only widths of $\leq 1$ μm. In one embodiment, the width of the charge compensation zones in the walls of the trench structure can be preferably set to less than 500 nanometers.

In one embodiment, the width of the charge compensation zones may be defined by the penetration depth of a dopant of the complementary conduction type into the drift zone material of the first drift zone type. This defines the penetration depth in wall regions of trench structures which are filled epitaxially with monocrystalline semiconductor material of the first conduction type. In one embodiment, these trench structures filled in monocrystalline fashion extend in the current path direction. In one embodiment, the penetration depth can be attained by means of a diffusion source which coats the walls of the trench structure and is introduced by means of a diffusion process as far as the defined penetration depth.

In another embodiment, the width of the charge compensation zones can be defined by an epitaxial growth thickness of a monocrystalline semiconductor material layer of the complementary conduction type. In this case, the monocrystalline semiconductor material layer is grown on wall regions of the trench structure and extends in the current path direction. In one embodiment, in a monocrystalline semiconductor material layer grown epitaxially, an abrupt pn junction is defined in the wall regions of the trench structure, which pn junction may, however, project beyond the original growth thickness as a result of a subsequent epitaxial filling of the trench structure with monocrystalline semiconductor material on account of diffusion processes.

One advantage of such a charge compensation zone is that it can be set relatively accurately by means of the growth thickness, the defect concentration and the width of the growth thickness being adapted to the requirements of the depletion of the charge carriers of the adjoining drift zones of the first and second drift zone types during off-state operation of the semiconductor component. This has the advantage that the defect concentration and thus the conductivity of the drift zones of the first and second conduction types can be significantly increased according to the doping and width of the charge compensation zones, thereby reducing the forward resistance of such semiconductor components.

In one embodiment, the charge compensation zones and the drift zones of the drift path can be arranged in strip-type fashion alongside one another between the electrodes. This embodiment makes it possible for the second drift zone type that is to be filled with monocrystalline semiconductor material to ensure a rectilinear current path between the two electrodes. The strip-type geometry of the walls of this trench structure advantageously results in elongated charge compensation zones in the walls of the trench structure. In one embodiment, on the other hand, it is also possible, by means of corresponding etching masks, to interrupt the edge structures of the trench walls in their longitudinal extent and thus to provide charge compensation pillars which are floating and isolated from one another by pn junctions. This merely may require a further process of patterning the already complementarily doped walls of the trench structures.

In one embodiment, the semiconductor body has a highly doped substrate of the first or of the complementary conduction type, on which is arranged a weakly doped to medium-doped epitaxial layer of the first conduction type with the drift path. In this case, the conduction type of the substrate depends on the type of semiconductor component to be fabricated. For unipolar semiconductor components the highly doped substrate has the same conduction type as the epitaxial layer, while for bipolar semiconductor components the highly doped substrate forms a complementary conduction type with respect to the conduction type of the epitaxial layer. In a semiconductor body of this type, the charge compensation zones extend with regard to their depth from a top side of the semiconductor body as far as a top side of the substrate.

In one embodiment, if, however, a nonpatterned, weakly doped pedestal epitaxial layer of the first conduction type is arranged in the semiconductor body between the drift path and the substrate, then the charge compensation zones extend with regard to their depth from the top side of the semiconductor body as far as a top side of the pedestal epitaxial layer. In this case, the thickness of the pedestal epitaxial layer is provided in such a way that the free charge carriers are completely or at least partly depleted when a reverse voltage is present by means of the pn junction that forms. The advantage of such a pedestal epitaxial layer first of all resides in the fact that the transition from the highly doped substrate to the weakly doped pedestal epitaxial layer enables a diminution from the high concentration of defects in the substrate to the low concentration of the doping in the drift zones or the pedestal epitaxial layer.

Furthermore, such a pedestal epitaxial layer has the advantage that the avalanche strength is increased.

In a further embodiment, the semiconductor component may have a proton-implanted layer in the region of the drift path transversely with respect to the current direction. The layer causes an additional donor doping in the implanted regions. This has the advantage that, with this proton-implanted layer, the dielectric strength of the pn junction is decreased locally and in a targeted manner by virtue of the choice of the implantation parameters, with the result that a higher avalanche strength can be achieved by means of this additional buried doping, which can be set by means of an adequate proton implantation. In one embodiment, the proton implantation can only be introduced in the cell array of the drift path if at the same time a polyimide layer of appropriate thickness protects the edge region from such a proton implantation. The edge region then automatically thereby acquires a higher blocking capability than the drift path of the semiconductor component.

In one embodiment, for a proton implantation, a linear accelerator is preferably used for producing n-doped regions in a semiconductor component, production of n-doped regions in compensation structures of the semiconductor component also being provided, in particular.

Furthermore, in one embodiment, it can be provided that the first and/or the second drift zone type has a monocrystalline semiconductor material of the first conduction type with impurity atoms which are arranged substitutionally and/or interstitially and reduce the diffusion coefficient of the complementarily doped defects. This has the advantage that the complementarily conducting defects of the compensation zones applied to the wall regions of the trenches are prevented from propagating or diffusing into the adjacent drift zone types.

In a further embodiment, the second drift zone type may have an epitaxially grown monocrystalline semiconductor material of the first conduction type in the trench structure provided with complementarily doped walls, a substitutionally and/or interstitially arranged carbon concentration [C] where $[C] \leq 1 \times 10^{20}$ cm$^{-3}$ being incorporated into the epitaxial layer with the growth of the epitaxy. Such a carbon concentration which is introduced into the trench structure with the growth of the monocrystalline semiconductor material has the advantage that defects of the complementary conduction type are prevented from diffusing out of the trench walls and into the second drift zone type, since the diffusion constant of the complementary defects in the monocrystalline semiconductor material structure is significantly reduced through such a carbon concentration. In one embodiment, this carbon concentration practically constitutes a diffusion barrier and significantly slows down propagation of the charge compensation zone, when the trench structure is being filled with monocrystalline medium-doped semiconductor material, into this newly growing material by diffusion. This holds true particularly if the complementary conduction type is doped with substitutionally arranged boron acceptors.

In one embodiment, the carbon concentration in the growing monocrystalline semiconductor material reduce the outdiffusion of the boron, whereby a lateral diffusion of boron from the trench walls into the growing semiconducting silicon material is reduced by the carbon concentration, which as a result makes it possible to reduce the forward resistance. In one embodiment, the same diffusion-inhibiting effect can also be achieved with a small proportion of germanium instead of carbon, since germanium also counteracts an outdiffusion of boron into silicon. However, when using germanium for preventing the lateral diffusion, it must be taken into account that the breakdown field strength of SiGe given the same free path length of the charge carriers is likewise reduced owing to the smaller band gap.

In a further embodiment, the second drift zone type may have a monocrystalline semiconductor material of the first conduction type in the trench structure provided with complementarily doped walls, the trench structure not being completely filled and having a termination filling with an insulation material, preferably with $SiO_2$, in the upper region of the trenches. Such a structure primarily has technical method-related advantages since the monocrystallinity in the upper region of the trench structure, as a result of the trench structure opening being overgrown prematurely, can lead to cavities in the monocrystalline material being filled.

In order to avoid this, in one embodiment, the filling of the trench structure can be ended prematurely, and the missing termination filling can be completed by an insulation material, the risk of cavity formation being lower in the case of termination fillings of this type. Furthermore, in the case of $SiO_2$ termination fillings cavities do not impair the electrical properties of the semiconductor component. In particular, the blocking capability of the semiconductor component continues to be ensured, despite shrink holes in the material of the insulating termination filling.

In one embodiment, it can furthermore be provided that the complementarily doped walls of the trench structure have, toward the filling monocrystalline semiconductor material of the second drift zone type and/or in the boundary with respect to the first drift zone type, a diffusion-inhibiting monocrystalline layer with $Si_xGe_yC_z$, where x>y and x>z, and the layer preferably comprises $Si_{0.86}Ge_{0.07}C_{0.07}$. A monocrystalline layer of this composition deposited on the trench walls of the trench structure has the advantage that it significantly impedes an outdiffusion of the complementary defects.

Since germanium in the silicon lattice is larger and thus brings about a local expansion of the lattice, while carbon is smaller than silicon and brings about a local lattice compression, a virtually equalized state results overall, so that the monocrystalline growth is relatively undisturbed given correspondingly small proportions of germanium and carbon, especially if these are in equilibrium. However, these local lattices effect distortions such that the outdiffusion of other substitutional dopants is impeded. In one embodiment, consequently, this coating of the trench structure also ensures that the complementary dopant principally remains in the trench walls and hardly contaminates or redopes the semiconductor material of the second drift zone type growing in monocrystalline fashion. In one embodiment, in order to exhibit such an effect, germanium and carbon are preferably arranged substitutionally on silicon crystal lattice sites.

Cubic SiC constitutes a relatively insurmountable diffusion barrier. In one embodiment, it may be applied to the complementarily doped walls of the trench structure as a diffusion-inhibiting crystalline layer. It is assumed in this case that the cubic SiC does not impede a monocrystalline growth from the bottom region of the trench structure, especially as this coating can be limited to the sidewalls of the trench structure. In one embodiment, cubic SiC may likewise be introduced on the inner side of the complementarily conducting layer.

In one embodiment, the semiconductor component may have an edge structure with at least one edge trench as edge termination. In one embodiment, from the edge trench, provision is made of at least one complementarily doped edge compensation zone of a trench wall along the edge of the semiconductor component, which zone may be floating. For this purpose, the adjoining trench has, toward the edge of the semiconductor component, semiconductor material grown in monocrystalline fashion. In one embodiment, the semiconductor material has, for its part, an edge contour which forms a curved contour through etching of the epitaxial layer grown in the edge trench. In one embodiment, the curved contour extends from the top side of the semiconductor body preferably right into the substrate in the region of the monocrystalline semiconductor material.

In one embodiment, an edge passivation layer can be arranged on the semiconductor layer with a contour of this type. An edge structure of this type may in principle be realized in the context of fabricating the drift path, with merely the above-described etching in the edge region and the edge passivation layer additionally being added. In one embodiment, the deposition and patterning of the edge passivation layer may again be coordinated with the application of a corresponding passivation layer to the semiconductor component. Consequently, only low additional costs and production risks arise for the fabrication of an edge structure of this type. It is only if, as mentioned above, the blocking strength in the drift path is slightly restricted by means of a proton implantation in order to increase the avalanche strength, and the edge compensation zone is protected from such a proton implantation by a correspondingly prepared masking, that the entire theoretical reverse voltage can be maintained in the edge region.

In one embodiment, the edge passivation layer preferably may have an $SiO_2$, an $Si_3N_4$, a DLC (diamondlike carbon), a thermally grown oxide and/or an SiC. What is crucial for the material of the edge passivation layer is its specific blocking capability, in order to ensure that when reverse voltages are present, no short circuits and/or creepage currents are possible via the edge structure of the semiconductor component. In one embodiment, an edge structure of this type can also be advantageous if the semiconductor component has no charge compensation zones in the drift path. In one embodiment, in that case, the edge structure can be equipped with an edge trench having an edge compensation zone with edge contour passivation, which may be floating.

In one embodiment, a method for fabricating semiconductor components may have the following method steps. Firstly, provision is made of a highly doped semiconductor wafer of a first or of a complementary conduction type having a multiplicity of semiconductor component positions, arranged in rows and columns, as a substrate for a semiconductor body. An epitaxial layer of the first conduction type is then grown onto said semiconductor wafer as starting material for a first drift zone type. Trench structures are introduced into this grown epitaxial layer in the semiconductor component positions of the semiconductor wafer. Afterward, the trench structure walls are doped by means of a dopant layer of a complementary conduction type for charge compensation zones. This is followed by anisotropically etching free the bottom region of the trench structure and the top sides of the first drift zone types.

In one embodiment, the anisotropic etching-free process is followed by growing a medium-doped epitaxial layer of the first conduction type in the trench structure as starting material for a second drift zone type. Since, during this growth, an epitaxial layer also grows on the top side of the mesa structures between the trench structures, there then follows a planarization of the top side of the semiconductor wafer as far as the grown drift zone types to form a semiconductor body with a planarized top side and with a drift path having two alternately arranged drift zone types of the first conduction type. In one embodiment, a first drift zone type has monocrystalline semiconductor material on a monocrystalline substrate, and a second drift zone type comprises monocrystalline semiconductor material in a trench structure with complementarily doped walls, the complementarily doped walls constituting the charge compensation zones of the semiconductor component.

In one embodiment, the completion of the drift paths in the semiconductor component positions is followed, on the semiconductor wafer, by the fabrication of top side structures and rear side structures in and/or on the semiconductor body in order to complete the semiconductor components. In one embodiment, the semiconductor wafer may subsequently be separated into individual semiconductor components.

This method has the advantage that, in particular for vertical semiconductor components, it is not necessary for a plurality of epitaxial layers to be deposited one on top of another. Furthermore, this method makes it possible to dispense with the fabrication of implantation masks and the subsequent photolithographies and implantations for the charge compensation cells of customary semiconductor components. Moreover, the method has the advantage that the grown epitaxial layer is optimally utilized, since it is possible to use even the trenches of the trench structure for the drift path as second drift zone type. This is neither provided nor feasible in all previous methods.

Finally, the method has the advantage that only a limited region of the trench walls is used for the formation of charge compensation zones. Through corresponding additional patterning measures, even for vertical semiconductor components, by means of anisotropically etching free the bottom region of the trench structure or by means of an additional etching step, it is possible to restrict charge compensation zones in the trench walls to individually floating charge compensation pillars, whereby an additional area is available for the drift path.

In comparison with the fabrication method as known from the patent specification DE 101 32 136 C1, this method makes it possible to realize very thin charge compensation zones, which leads to a better forward resistance for the same dielectric strength. The necessary compensation charge is kept ready in the charge compensation zones, that is to say at most double the breakdown charge in the lateral direction in order that the charge can be completely depleted in the off-state case. Since the compensation zones do not have to be outdiffused, as is necessary in the patent specification DE 101 32 136 C1, in order to form a continuous compensation pillar, it is possible to fabricate charge compensation zone strips and/or charge compensation zone pillars that are made very narrow. In comparison with present-day CoolMOS, therefore, higher area proportions are available through the first and second drift cell types for the current transport, which, for the same doping in the drift cell types, already leads to a reduced product of forward resistance×cross-sectional area ($R_{on}$×A) of the drift cells.

Moreover, the photoresist tolerances of the masking trench structure photoresist technique do not affect the degree of compensation when a strip layout is used. A deviation of the resist or trench etching dimension merely has the effect that a compensation zone is at a somewhat greater distance from the left-hand neighbor than from the right-hand neighbor. This may have a slight influence on the output capacitance and the feedback capacitance of the semiconductor component, but not on the charge carrier compensation. In one embodiment, consequently, in an advantageous manner the photolithography does not have a limiting effect on the reduction of the feature sizes, in particular on the reduction of the width of the charge compensation zones. A limitation arises from the area requirement of the drift path itself. The form of the trench or its width variation into the depth likewise hardly affects the degree of compensation.

A further advantageous aspect with regard to the tolerances is apparent upon considering the thickness and doping fluctuations of the epitaxial deposition. During the epitaxial growth for conventional charge compensation semiconductor components, fluctuations of +/−10% of the deposited dose (thickness×dopant concentration) have to be reckoned with, which means that this has to be biased by means of a sufficiently small spacing of the charge compensation zones or correspondingly a lower maximum doping.

In one embodiment, a weakly doped pedestal epitaxial layer of the first conduction type can be grown prior to growing an epitaxial layer of the first conduction type on the semiconductor wafer. This method variant has the advantage that the avalanche strength is increased by the pedestal epitaxy. Since the trench depth directly influences the charge compensation in the region of the pedestal epitaxy, it is advantageous to precisely control depth fluctuations of the trench etching in order to ensure that the pedestal epitaxy is always attained during the trench structure etching. This may be effected from a production engineering standpoint by means of an interferometric in-situ measurement of the trench depth, or be made possible by means of corresponding auxiliary layers, e.g. for the end point control of the etching.

In one embodiment, if the pedestal epitaxy is dispensed with, then a subsequent trench etching right into the highly doped substrate may be effected. That proportion of the complementarily conducting region of the charge compensation zones which is then situated in the substrate is unimportant for the charge compensation. All that is significant is that proportion of the charge compensation zones which lies embedded in the epitaxial layer and is prescribed by the epitaxial layer thickness. Fluctuations in the trench depth have a negligible influence on the charge carrier compensation in this case. In one embodiment, however, a slight increase in the forward resistance is possible since the second drift zone type then reaches into the highly doped n-type region of the substrate.

In a further embodiment, prior to growing an epitaxial layer of the first conduction type for the first diffusion zone type on the semiconductor wafer or on the pedestal epitaxial layer, a patterned auxiliary layer can be applied epitaxially in regions of the trenches to be etched. Said auxiliary layer enables an etching stop or an etching end point control and preferably has $Si_xGe_y$ where x>y or $Si_xGe_yC_z$ where x>y and x>z. In one embodiment, since both germanium and carbon are preferably incorporated substitutionally into the silicon lattice, they do not significantly disturb the epitaxial growth of a monocrystalline semiconductor region on the semiconductor wafer.

In one embodiment, however, during etching into the grown epitaxial layer, the auxiliary layers form an etching stop or an end marking in the case of which the etching of the trenches can be slowed down during a wet etching process. In one embodiment, during a dry etching process in a plasma, upon reaching the trench depth it is possible to detect the sputtered germanium and carbon ions occurring in the plasma, and a corresponding etching stop of the dry etching method can be initiated. Consequently, it is possible with this method variant to achieve a very precise trench depth. In one embodiment, for this purpose, the composition of the patterned auxiliary layer made of $Si_xGe_yC_z$ where preferably $0.86 \leq x \leq 1$, $y \leq 0.07$ and $z \leq 0.07$ is advantageous since such low concentrations of germanium and/or carbon only slightly influence the monocrystalline growth.

In one embodiment, a further aspect for providing an auxiliary layer consists in the fact that, prior to growing an epitaxial layer of the first conduction type onto the semiconductor wafer or the pedestal epitaxial layer, a patterned auxiliary layer is applied in regions of the trenches to be etched, which auxiliary layer preferably has a semiconductor oxide or a semiconductor nitride layer, the structure of the auxiliary layer being applied in the regions of the trenches to be etched in a fine structure such that a lateral monocrystalline overgrowth of the fine structure is made possible. In this case, too, the detection of oxygen or nitrogen during dry etching in a plasma can then be used for the etching stop or as a signal for the depth control of the dry etching.

With a further embodiment, it is provided that for the purpose of introducing the trench structure into the epitaxial layer of the first conduction type, an etching mask is applied photolithographically to the semiconductor wafer with strip-type patterns in the region of the drift path in the semiconductor component positions. In one embodiment, after the application of the etching mask, the trench structure is then introduced—by means of an anisotropic etching—into the epitaxial layer grown in monocrystalline fashion. The anisotropic etching ensures that the trench structure has relatively perpendicular, rectilinear sidewalls. In one embodiment, in some cases, barrel-shaped or conical or deeply undercut contours also arise for the trench cross section, these contours not impairing the introduction and the mode of operation of the charge compensation zones in the trench walls.

In one embodiment, the anisotropic etching may be carried out with the aid of an anisotropic reactive ion etching. During the reactive ion etching, ions are used which not only solely sputter the semiconductor material in the region of the trench structure, but at the same time achieve a higher etching rate in a preferred direction through a chemical reaction with the epitaxial material. In one embodiment, instead of a reactive ion etching, a directional plasma etching is also possible, during which the material of the trench structure is merely sputtered. What can be particularly advantageous in the case of this dry etching method is that the etching can be carried out with end point detection. Said end point detection is possible as a result of the abovementioned auxiliary layers, because the liberated ions of the auxiliary layer then occur during etching in reaction gas, so that an etching stop can be triggered from a production engineering standpoint. In one embodiment, after this selective etching, the mask is removed, so that the first drift zone type is now present on the surface of the semiconductor wafer, said first drift zone type being present in the form of mesa structures, which are also called "mesas", between the introduced trenches.

In one embodiment, extremely high aspect ratios are not required for the trench etching, so that the method opens up a further possibility of miniaturization by way of a reduction of the trench structure width. In one embodiment, the trench etching is preferably set for a sidewall angle of 90 degrees. In one embodiment, however, it is known that barrel-shaped or bulbous cross sections of the trenches can be formed. In one embodiment, these bulbous trenches are also preserved after the isotropic growth of the complementary semiconductor material onto the trench walls and have the effect that the subsequent anisotropic etching can remove virtually no complementarily conducting semiconductor material from the trench walls or the almost vertical sidewalls. Accordingly, the sidewall angle does not control the compensation charge at the vertical sidewalls, but principally the accuracy of the grown or indiffused layer thickness in the vertical sidewalls. This is a significant advantage over previously known methods for fabricating charge compensation zones in drift paths.

In one embodiment, prior to applying the etching mask, it is possible, in order to increase the method reliability, to apply a patterned end point control layer for the etching-back after epitaxial filling of the etched trenches. Said end point control layer is applied to the monocrystalline epitaxial layer in the regions which remain in the form of mesas after the trench etching. In one embodiment, precisely like the auxiliary layer mentioned above, the end point control layer may preferably be applied from a semiconductor oxide and/or a semiconductor nitride and/or an $Si_xGe_yC_z$ layer where x>y and x>z, preferably with $Si_{0.86}Ge_{0.07}C_{0.07}$, said end point control layer covering only the top sides of the first diffusion zone type.

Moreover, the method can thereby become more reliable if, after the introduction of the trench structure and prior to the doping of the trench walls, the surfaces of the trench structure are chemically cleaned. In one embodiment, for this purpose, the surfaces of the semiconductor wafer may also be oxidized and the oxide layer may subsequently be etched away by means of corresponding wet etchings. In one embodiment, finally, it is also possible to carry out a hydrogen heat treatment step which advantageously smoothes the trench walls.

A further embodiment of the method involves firstly depositing an epitaxial layer on the semiconductor substrate with a weak doping of the first conduction type. This weak doping of the mesas may lead, after the introduction of the trench structure, e.g. by doping from the gas phase, to the increasing of the concentration of the first conduction type in the mesas to a predetermined value. This has the advantage that, independently of individual semiconductor types, it is possible to predetermine a uniformly weakly doped epitaxial layer on correspondingly uniformly highly doped wafers, and the actual medium-high concentration in the first diffusion zone types is finally set and adapted only after the introduction of the trenches. This also reduces the costs of storage and simplifies stock keeping of corresponding semiconductor wafer substrates with a weakly doped epitaxial layer already applied.

In one embodiment, preferably, a relatively highly doped, complementarily conducting monocrystalline layer may be grown epitaxially on the semiconductor wafer for the purpose of doping the trench structure walls by means of a dopant layer to form charge compensation zones. In this case, the entire semiconductor wafer is coated with a correspondingly thin, complementarily relatively highly doped layer, so that both the bottom region of the trenches and the top side region of the mesas subsequently have to be freed of this highly doped, complementarily conducting layer. For this purpose, both the auxiliary layers as have been applied directly to the substrate and the end point control layers on the mesas are advantageous since, with their support, it is possible to effect a very accurate and precise removal of the epitaxially grown, complementarily highly doped layer in the bottom region and also in the top side region of the mesas.

Fluctuations during an anisotropic etching-back of the complementarily relatively highly doped layer in the bottom region have a negligible influence on the charge compensation and on the forward resistance, because the thickness of the complementarily conducting layer to be etched is of the order of magnitude of, for example, 500 nm thickness. Accordingly, expected depth fluctuations in the range of 50 to 100 nm are no longer significant compared with the drift path length, which is 40 μm, for example, and corresponds to the trench structure depth.

In one embodiment, a highly doped, complementarily conducting monocrystalline layer for doping the trench structure walls to form charge compensation zones is grown with a thickness d of between 100 nm$\leq$d$\leq$1000 nm, preferably 200 nm$\leq$d$\leq$600 nm, onto the trench structure. It is thus possible, in a relatively precise manner, both to set the concentration of the defects in the trench structure walls and to comply with the thicknesses provided for the charge compensation zones.

In one embodiment, an alternative possibility to the epitaxial deposition of charge compensation zones on the trench structure walls is to dope the trench structure walls to form charge compensation zones with the aid of a doped glass layer which is deposited as a diffusion precoating onto the areas of the trench structure, and the glass layer is completely removed after the diffusion precoating step. In one embodiment, isotropic etching methods which are selective with respect to silicon may be used for removing the glass layer, while anisotropic etching methods are used for removing the doped bottom layer of the trench structure and also the doped top side of the mesas, in order clearly to obtain the charge compensation zones in the trench walls to the greatest possible extent.

In one embodiment, besides the possibility of depositing glass layers in order to fabricate charge compensation zones in the trench structure walls, there is also the possibility of doping the trench structure walls from the gas phase with subsequent postdiffusion. In one embodiment, finally, it is possible, for fabricating charge compensation zones, to carry out an atomic layer deposition of the dopant on the areas of the trench structure with subsequent partial or complete indiffusion of the deposited atomic layers into the walls.

Further embodiments of the method make it possible to ensure that during the epitaxial deposition of monocrystalline semiconductor material in the trenches, the introduced dopants are impeded from diffusing out of the trench walls.

For this purpose, it is provided that, after the doping of the trench structure walls to form charge compensation zones diffusion-inhibiting monocrystalline auxiliary layers are applied on the areas of the trench structure, which layers correspond in terms of construction and composition to the materials already discussed in detail above as auxiliary layers or simply represent an n-doped Si protective layer. In one embodiment, the auxiliary layers have the particular feature that they do not impede the monocrystalline growth in the trenches for a second drift cell type.

In one embodiment, that goes beyond this for providing a diffusion-inhibiting layer on the top side of the trench structure consists in depositing, or introducing below the complementarily conducting layer, an amorphous silicon or a silicon carbide, preferably a cubic silicon carbide, or a silicon germanium on the areas of the trench structure with a thickness of 10 nm$\leq$d$\leq$300 nm, preferably 50 nm$\leq$d$\leq$150 nm. The amorphous silicon, which can be deposited isotropically on the trench structure walls at temperatures as low as below 350° C., has the advantage that even at 700° C., that is to say still before the temperature required to grow monocrystalline silicon from the gas phase in the trench structures, it itself undergoes transition to the crystalline form of silicon.

It is assumed in this case that, on account of this minimal thickness between 10 nm$\leq$d$\leq$300 nm, the amorphous silicon layer is converted completely and uniformly into a monocrystalline silicon layer which is then available as a seed layer for the growth of monocrystalline semiconductor material in the trench structure for the second drift cell type. This diffusion-inhibiting layer is beneficial only for the trench structure walls in order to prevent outdiffusion of the defects introduced into the wall structure. In one embodiment, consequently, it is expedient for both the bottom of the trench structure and the top sides of the mesas to be freed of this material by means of an anisotropic dry etching method. The possible anisotropic dry etching methods have already been discussed in detail above and are not discussed again here.

In one embodiment, prior to growing a medium-doped epitaxial layer of the first conduction type in the trench structure, the trench structure walls can be etched in such a way that they have a bevel, so that the width of the trench structure at the top side of the semiconductor wafer is greater than in the bottom region of the trench structure. This trapezoidal cross section of the trench structure has the advantage that a premature closure of the top side of the trench structure is prevented when growing the monocrystalline medium-doped semiconductor material for the second drift zone type.

In one embodiment, prior to growing a medium-doped epitaxial layer of the first conduction type (n) in the trench structure, the trench walls (14, 15) are etched in such a way that they have a curvature, so that the width at the top side (18) of the semiconductor body (4) is approximately equal to the width in the bottom region (30) of the trench structure (13) and the trench structure is in this case undercut approximately in barrel-shaped fashion. Therefore, the monocrystalline growth is advantageously stopped before the trench width of the top side is closed, so that the barrel-shaped central region remains accessible for further process steps.

In one embodiment, prior to growing a medium-doped epitaxial layer (22) of the first conduction type (n) in the trench structure (13), the trench walls (14, 15) are etched in such a way that they have a bevel, so that the width of the trench structure (13) at the top side (18) of the semiconductor body (4) becomes less than in the bottom region (30) of the trench structure (13). This method variant has the advantage that, before the trench structure is overgrown at the top side, the monocrystalline growth can be stopped, and the wider bottom region of the trench structure remains accessible for further process steps.

In one embodiment, it can be provided that, for the first epitaxy or for the purpose of growing a medium-doped epitaxial layer of the first conduction type in the trench structure, as starting material for a second drift zone type, the epitaxial material is doped with carbon up to a concentration [C] where $[C] \leq 1 \times 10^{20}$ cm$^{-1}$ or an identically acting element. What is achieved by means of this method variant is that the epitaxial layer itself which fills the trench structure acts as a diffusion-inhibiting layer against outdiffusion of defects from the complementarily highly doped trench walls.

In one embodiment, it can be provided that when growing a medium-doped epitaxial layer of the first conduction type in the trench structure, as starting material for a second drift zone type, the trench structure is not completely filled with epitaxial material and an oxide filling is provided as termination of the trench structure. This has the advantage that the critical termination of the filling of the trench structure depends on an oxide material, cavities which arise during this oxide filling having a less critical effect on the properties of the semiconductor component than if shrink holes or cavities occur in the monocrystalline semiconductor material in the upper trench structure region. In this case, it has proved worthwhile to use this method variant preferably for trench structures with a barrel-shaped cross section of the trenches and/or a cross section of the trenches which enlarges toward the trench depth.

In one embodiment, as an alternative, the trench structure may be filled with intrinsically conducting polysilicon. In this case, a component is realized which enables a high-resistance connection between the source region and the drain region, so that the abovementioned advantages are fully manifested.

In one embodiment, a semiconductor wafer with an extremely uneven top side is present after the filling of the trench structure. This unevenness of the top side is not advantageous, however, for further processing to form a semiconductor component. In one embodiment, rather, a step of planarizing the top side of the semiconductor wafer to form a semiconductor body with a planarized top side and with a rear side is now carried out. For this purpose, preferably, firstly a leveling photoresist layer is applied to the uneven top side. In the selection of the material of the photoresist layer, care is taken to ensure that the selectivity factor with respect to the semiconductor material of the drift cell types in conjunction with the etching or removal methods chosen is almost 1. That is to say that the removal during the planarization of the leveled top side can undergo transition from a photoresist layer completely uniformly and evenly to the removal of the uneven semiconductor material. In this case, both the photoresist material and the epitaxial material are correspondingly etched back during the planarization of the top side of the semiconductor wafer as far as the grown drift zone types. An alternative method would be CMP (chemical mechanical polishing).

In one embodiment, after the planarization of the top side of the semiconductor wafer, the latter can be subjected to a proton implantation, which is masked e.g. in the edge region, from the planarized top side. In one embodiment, said proton implantation may also be carried out from the rear side of the semiconductor wafer. In one embodiment, after the introduction of the proton implantation, the semiconductor wafer is annealed at temperatures T where $350°$ C. $\leq T \leq 500°$ C. This proton implantation affords the advantage, in particular in the drift path region of the two drift cell types, that the avalanche strength of the entire semiconductor component is improved.

In this case, the proton implantation may be effected not only directly after the planarization, but also later in the fabrication process.

In all embodiments, the semiconductor component can be a power semiconductor component. In the following embodiments using a power semiconductor are disclosed. However, depending on the application, other semiconductor components may be used. The principles of the present application are, thus, not restricted to power semiconductors.

FIG. 1 shows a schematic cross section through a power semiconductor component 1, in accordance with a first embodiment. The power semiconductor component 1 has, in a semiconductor body 4, a drift path 5 between two electrodes 6 and 7. The drift path 5 between the electrodes 6 and 7 provides a current path between the electrodes 6 and 7 with a first conduction type n. Furthermore, the drift path 5 has charge compensation zones 11 of a complementary conduction type p, which constrict the current path of the drift path 5. Two alternately arranged drift zone types 9 and 10 are arranged in the drift path 5, a first drift zone type 9 having monocrystalline semiconductor material on a monocrystalline substrate 12 and the second drift zone type 10 having monocrystalline semiconductor material in a trench structure 13 with complementarily doped trench structure walls 14 and 15, the complementarily doped walls 14 and 15 having the charge compensation zones 11.

The power semiconductor component 1 illustrated here is a vertical field effect power transistor, for example.

The drift path 5 according to an embodiment with charge compensation structure 3 in the walls 14 and 15 of the trenches filled with monocrystalline semiconductor material may, however, also be used for lateral high-voltage field effect transistors. Bipolar power transistors may also be equipped with such a drift path according to an embodiment. In this case, unlike what is shown in FIG. 1, the drift path is not constructed on a highly doped substrate of the same conduction type as the drift zones, rather the highly doped substrate is doped in complementarily conducting fashion with respect to the drift zones. Bipolar IGBT transistors (isolated gate bipolar transistors) or PN$^-$N$^+$ diodes and Schottky diodes may also have this drift path structure with charge compensation zones 11 in trench structure walls 14 and 15.

In the case of the embodiment as shown in FIG. 1, the trench structure 13 does not reach as far as the highly doped substrate 12, rather a weakly doped pedestal epitaxial layer is arranged between the highly doped substrate 12 and the drift path 5. Such a pedestal epitaxial layer serves to improve the avalanche strength. In the case of this power semiconductor component 1 with a vertical drift path 5, complementarily conducting body zones 39 are arranged in proximity to the top side 18 of the semiconductor body 4, which body zones are flooded with charge carriers when an activation potential is applied to a gate electrode 8, and activate the current path between the source electrode 6 and the drain electrode 7 in the drift zones 9 and 10.

In this case, by virtue of the extremely narrow charge compensation zones 11 of the charge compensation structure 3 that are arranged in the trench structure walls 14 and 15, an increased defect concentration is permitted in the drift zones 9 and 10, which significantly reduces the forward resistance in activation operation of the power semiconductor component 1. The small cross-sectional area and thus the small volume proportion which the charge compensation structure 3 according to an embodiment constitutes in comparison with the activation volumes of the drift zone types 9 and 10 also contribute to a reduced forward resistance.

FIGS. 2 to 12 show schematic diagrams regarding individual method steps in the fabrication of the power semiconductor component 1 in accordance with FIG. 1.

FIG. 2 shows a schematic cross section through a highly doped substrate 12 after application of a pedestal epitaxial layer 20 to the substrate top side 19 and after application of a further, medium-doped epitaxial layer 17 to the top side 21 of the weakly doped pedestal epitaxial layer 20. In this case, both the highly doped substrate 12 and the weakly doped pedestal epitaxial layer 20 and the medium-doped epitaxial layer 17 for the fabrication of a power semiconductor component 1 of the first embodiment have the same first conduction type. As shown in the subsequent figures, the first drift zone type can be constructed from the medium-doped epitaxial layer 17 by introduction of a trench structure.

FIG. 3 shows a schematic cross section through a highly doped substrate 12 after application of a pedestal epitaxial layer 20 and a patterned auxiliary layer 32. Said auxiliary layer 32 is applied still prior to the application of the medium-doped epitaxial layer 17 to the top side 21 of the pedestal epitaxial layer 20, in order to provide a control layer for the etching of a trench structure. For this purpose, elements which can be detected in the liberated material during a dry etching method of the trench structure are introduced into the control layer or into the auxiliary layer. As auxiliary layers, it is also possible to deposit materials on the top side 21 of the pedestal epitaxial layer which do not further disturb the monocrystalline growth of the medium-doped epitaxial layer 17 and constitute an etching stop layer in which the etching process is slowed down significantly.

Such an auxiliary layer 32 may have monocrystalline material having $Si_xGe_yC_z$, where x>y and x>z, and a composition comprising $Si_{0.86}Ge_{0.07}C_{0.07}$ is preferably provided. Other control or etching stop layers may have oxides or nitrides of the semiconductor material in finely patterned form, that is to say that the fine structure of such an auxiliary layer 32 permits a lateral, monocrystalline overgrowth of the finely structured auxiliary layer 32. Finally, there is also the possibility of producing an auxiliary layer 32 by means of selective carbon implantation into the top side 21 of the pedestal epitaxial layer 20, said auxiliary layer having face-centered cubic SiC clusters which may serve as an end point control layer and/or etching stop layer for the introduction of the trench structure.

Figure 4:
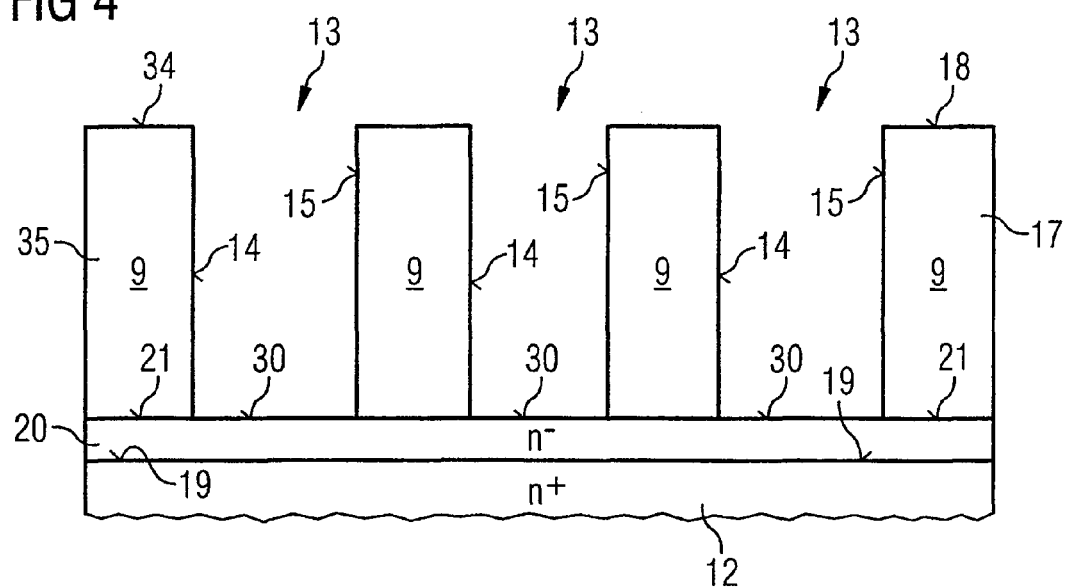

FIG. 4 shows a schematic cross section through the highly doped substrate 12 in accordance with FIG. 2, after introduction of a trench structure 13. In this case, the auxiliary layer shown in FIG. 3 has simultaneously been concomitantly removed in the bottom region 30 during the introduction of the trench structure 13. From the medium-highly doped epitaxial layer 17 of the first conduction type n shown in FIG. 2 and FIG. 3, there remain after the introduction of the trench structure 13 mesa structures, also called "mesas" 35, having a top side 34. This completes the first drift zone type 9 with a medium-high doping of the first conduction type n on the substrate 12. The next step is then to fabricate the complementarily doped charge compensation zones on the trench structure walls 14 and 15.

Figure 5:
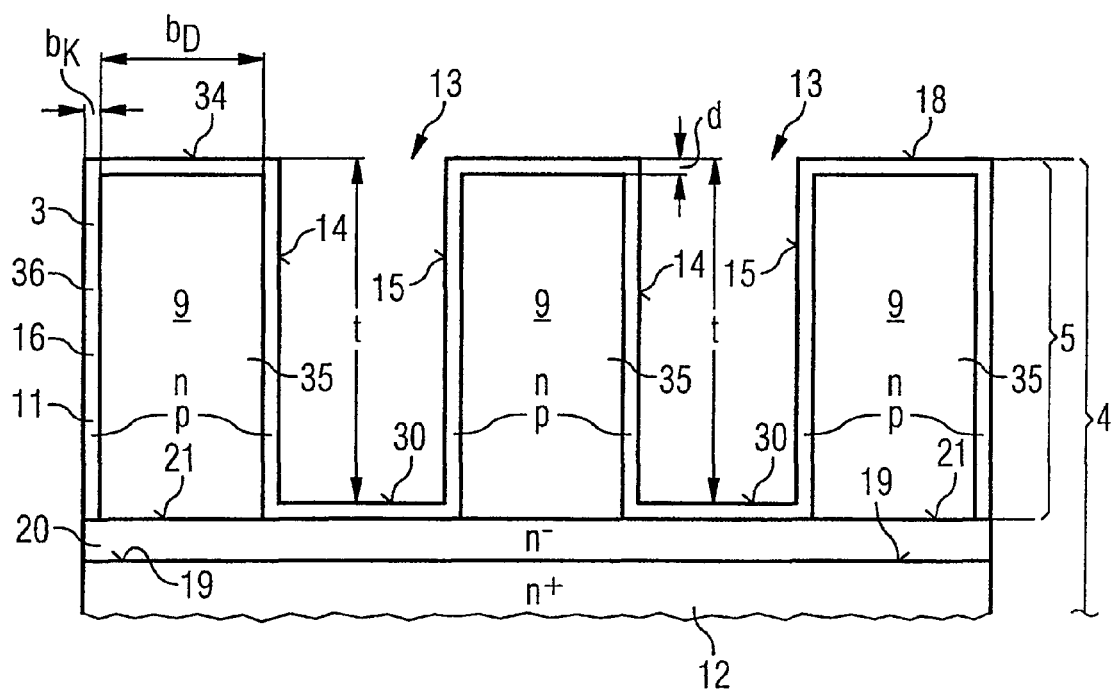

FIG. 5 shows a schematic cross section through the highly doped substrate 12 in accordance with FIG. 4, after growth of a complementarily highly doped, monocrystalline epitaxial layer 36 on the top sides of the trench structure 13, and also on the top side 34 of the mesas 35. This thin epitaxial layer 36 having a thickness d of between 100 nm$\leq$d$\leq$1000 nm, preferably 200 nm$\leq$d$\leq$600 nm, may be applied in the region of the drift path 5 to be formed for a multiplicity of power semiconductor components 1 on a semiconductor wafer, especially as all the surfaces of this structure are formed by monocrystalline semiconductor material.

In the embodiment as is shown in FIG. 5, the thickness d is 500 nm. This thickness d also defines the width $b_K$ of the charge compensation zones 11 applied on the trench structure walls 14 and 15. In this exemplary embodiment, the height h of the mesas 35 corresponds to the trench depth t of the trench structure 13. The walls 14 and 15 of the trench structure 13, which are shown rectilinear here, may also open out obliquely toward the top, with the result that the trench structure 13 is wider in the region of the top side 34 of the mesas 35 than in the bottom region 30. The cross section of the trenches may also be formed in barrel-shaped fashion; these different embodiments of the wall contour of the walls 14 and 15 are partly connected with the different etching techniques. Preferably, an anisotropic etching is performed through a corresponding etching mask.

Figure 6:
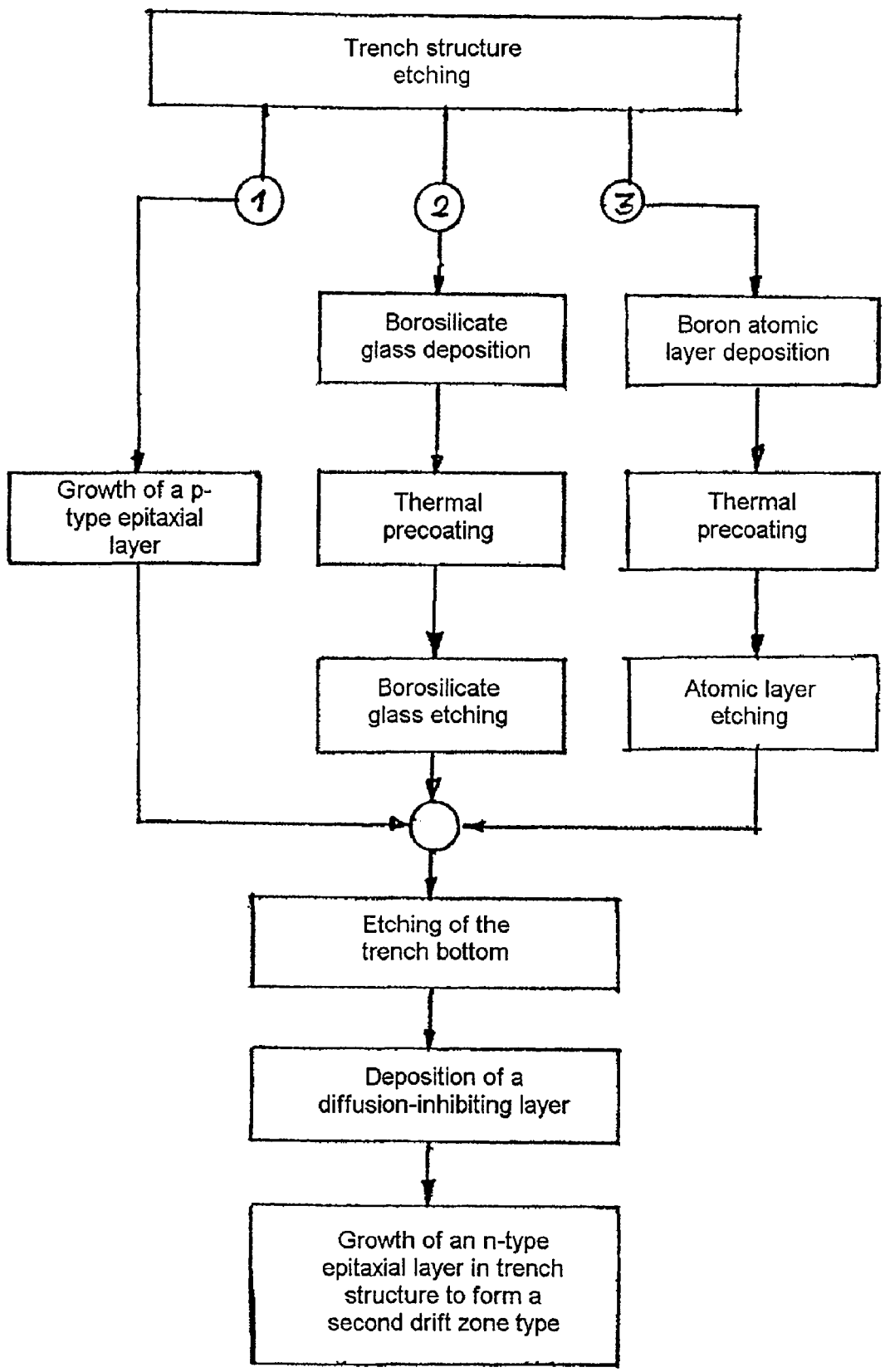

FIG. 6 shows a scheme for the fabrication of a second drift zone type made from monocrystalline semiconductor material in a trench structure with complementarily doped trench structure walls, which form charge compensation zones, with three variants for the fabrication of complementarily doped trench structure walls. These three variants are denoted by the numerals 1, 2 and 3.

The first variant 1 is growth of a complementarily conducting epitaxial layer onto the surfaces of the trench structure produced after the trench structure etching as is already shown in FIG. 5. The second variant consists in providing borosilicate glass depositions on the trench structure. After the deposition of a borosilicate glass, a thermal precoating is carried out, which may also be performed as RTP precoating (rapid thermal processing) which suffices to cause a sufficient number of boron atoms with high concentration to penetrate into the trench structure walls. The borosilicate glass is subsequently removed by means of a borosilicate glass etching.

A third variant consists in firstly depositing boron atomic layers or boron-containing compounds in molecular layers, which are likewise subjected to a thermal precoating. An etching-back is subsequently carried out in order to leave only the high concentration of boron atoms that penetrated during the thermal precoating in the trench structure walls. The resulting thickness or width of the charge compensation zones in the trench structure walls is defined by the penetration depth of the boron into the monocrystalline semiconductor material of the first drift zone type.

After the introduction or growth of material with a complementary conduction type, the highly doped layer made of complementarily conducting material is limited to the trench structure walls by etching the trench bottom and also by etching back the top sides of the mesas. In order to prevent, in the course of filling the trench structure with monocrystalline semiconductor material, said semiconductor material from being contaminated or doped by outdiffusion of complementary defects from the trench walls, a diffusion-inhibiting layer is deposited on the structure walls in a further production step shown in FIG. 6.

The diffusion-inhibiting layer may have a material such as has already been discussed above for the auxiliary layers. Moreover, it is possible to deposit an amorphous silicon layer on the trench walls, which even below the temperatures of the epitaxial deposition of monocrystalline semiconductor material is itself converted into crystalline material at approximately 700° C., and thus transfers the monocrystalline information. A so-called cap layer of this type has the advantage that it impedes the outdiffusion of defects from the wall region, but does not impair the formation and the growth of monocrystalline silicon material proceeding from the bottom of the trench structure. This last step in the diagram shown in FIG. 6, namely the growth of an n-type epitaxial layer in the trench structure, yields the second drift zone type, which, together with the first drift zone type, provides a drift path which now, minus the extremely narrow compensation zones, is completely available for the current path in power semiconductor components.

Figure 7:
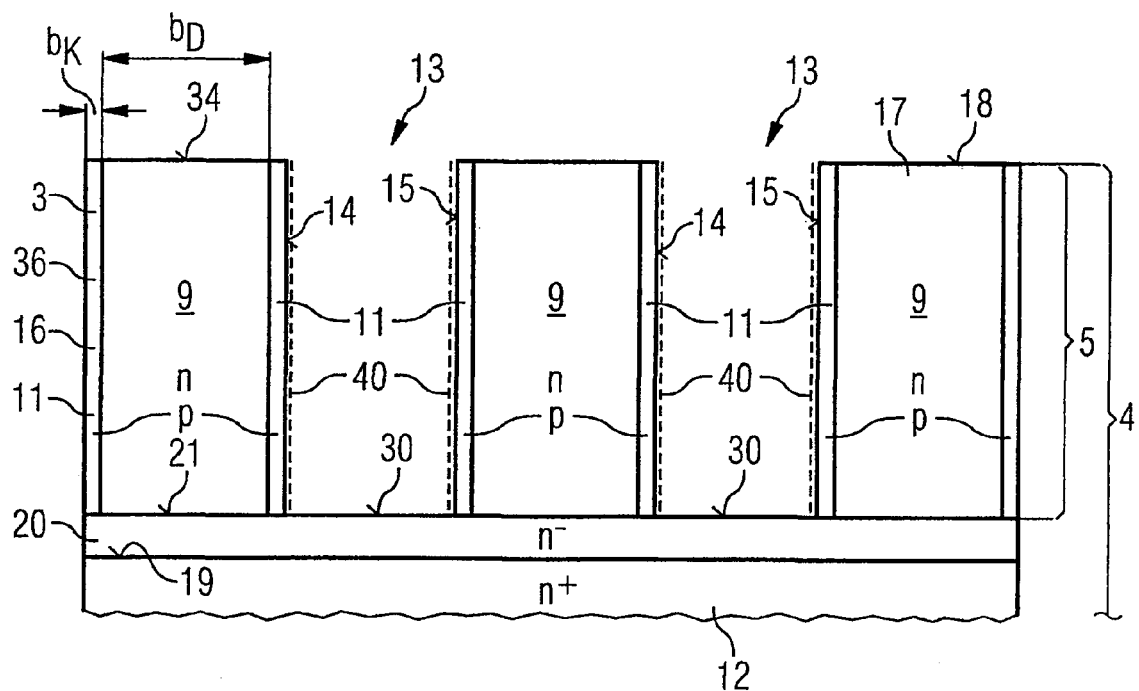

FIG. 7 shows a schematic cross section through the substrate 12 in accordance with FIG. 5, after etching free the bottom region 30 of the trench structure 13 and the top side 34 of the first drift zone type 9 in mesa form. The broken line 40 on the trench walls 14 and 15 in FIG. 7 shows the abovementioned different wall coatings, instances of etching-back and diffusion-inhibiting embodiments of the wall structure for the introduction of the second drift zone type into the trench structures 13. In addition, prior to the introduction of a monocrystalline semiconductor material filling, the trench walls 14 and 15 of the trench structure 13 may be chemically cleaned, or oxidized and subsequently etched or reduced, and, finally, it is possible to smooth the trench walls for a monocrystalline deposition by means of a hydrogen heat treatment step.

Figure 8:
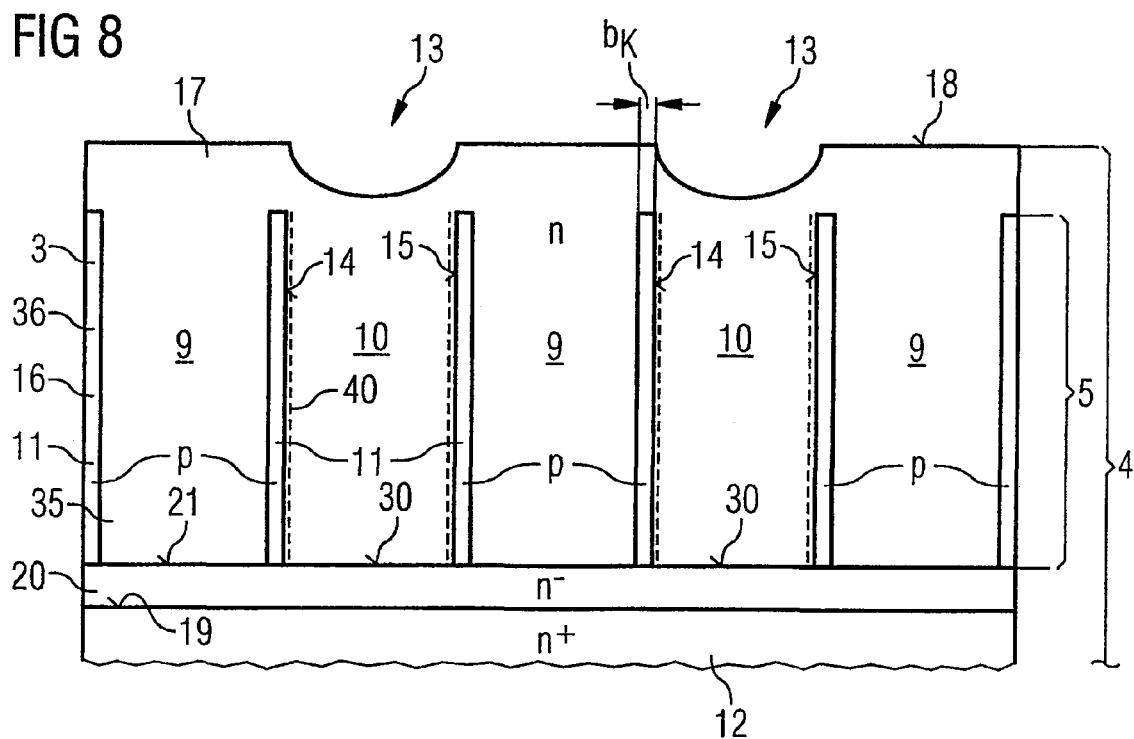

FIG. 8 shows a schematic cross section through the substrate 12 in accordance with FIG. 7, after growth of a monocrystalline semiconductor material in the trench structures 13 for a second drift zone type 10. In this case, the top sides of the mesas 35 of the first drift zone type 9 are also overgrown by monocrystalline material, thus resulting in a relatively fissured top side 18 for the semiconductor body 4. This uneven and fissured top side 18 is planarized by means of subsequent method steps.

Figure 9:
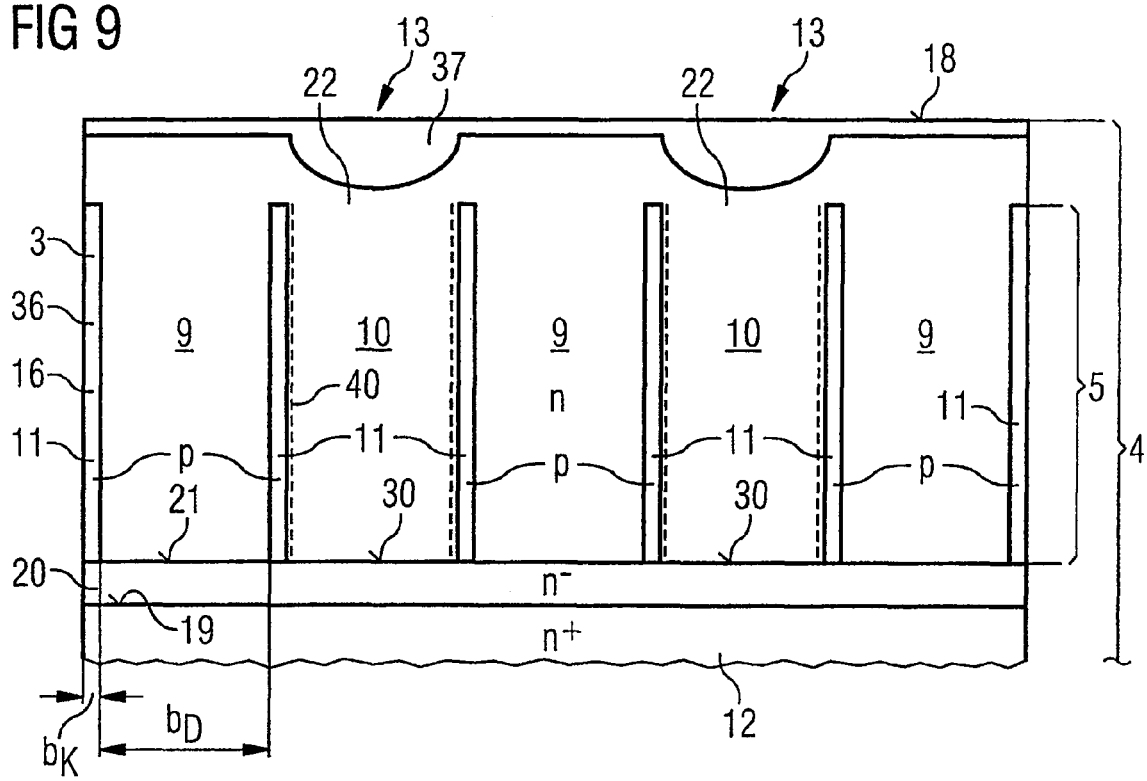

FIG. 9 shows a schematic cross section through the substrate 12 in accordance with FIG. 8, after leveling of the top side 18 of the semiconductor body 4 by means of a photoresist layer 37. Photoresist layers can be applied to a semiconductor wafer with an uneven surface 18, and initially planarize unevennesses on account of their tough viscous properties. After the photoresist layer has been cured, such photoresists may achieve a selectivity with respect to the semiconductor material of 1, so that the leveling photoresist and the semiconductor material are removed in the same way during the etching-back step. Instead of a photoresist layer 37, other materials, for example spin-on glass, may also be used as planarizing layers.

Figure 10:
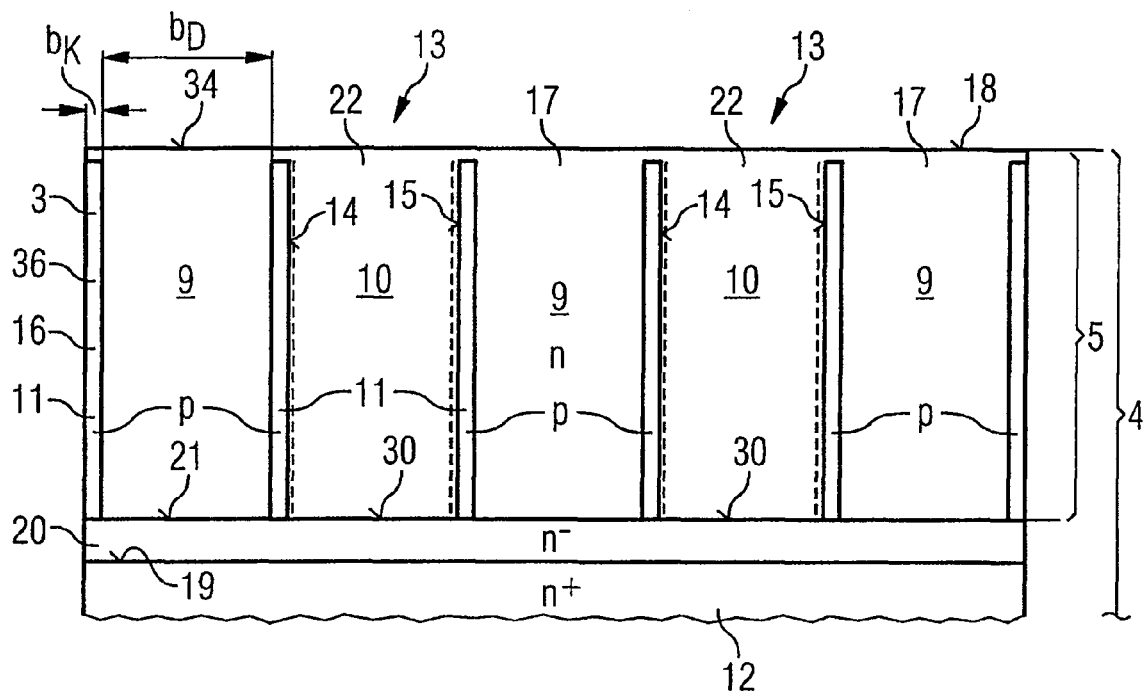

FIG. 10 shows a schematic cross section through the substrate 12 in accordance with FIG. 9, after etching back the top side 18 of the semiconductor body 4. On account of the leveled photoresist layer shown in FIG. 9, there now also arises an etched-back top side 18 of the semiconductor body 4 which is completely planarized. After the planarization, it is then possible to introduce top side structures and rear side structures in and/or on the semiconductor body for completion of the power semiconductor component into corresponding power semiconductor component positions of a semiconductor wafer.

Figure 11:
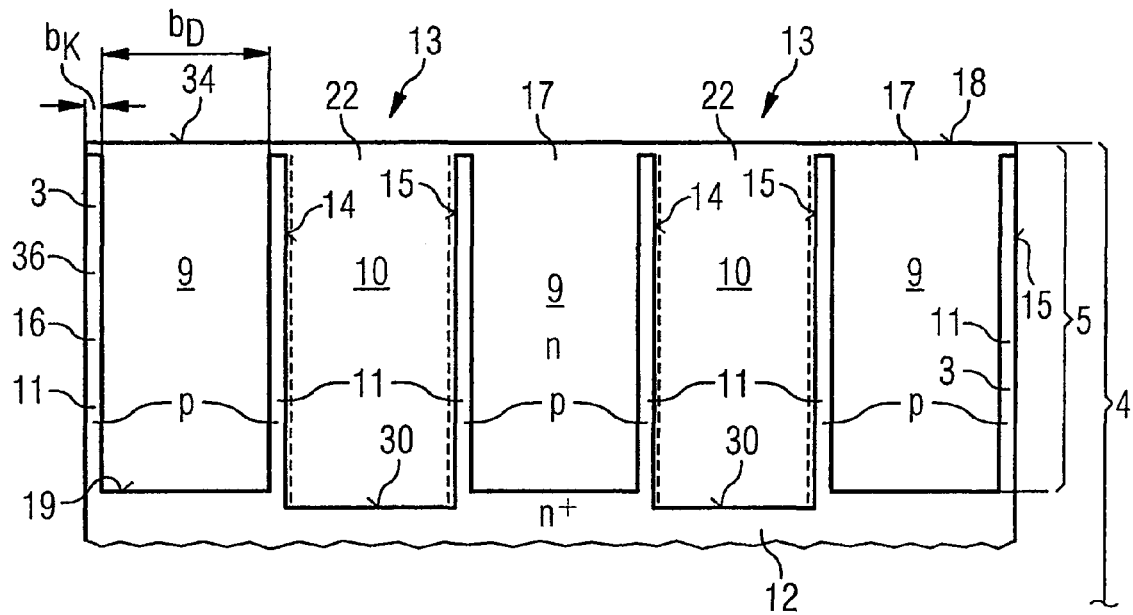

FIG. 11 shows a schematic cross section through the substrate 12 after etching back the top side 18 with a variant of the construction of the semiconductor body 4. In the case of this variant of the semiconductor body 4, no pedestal epitaxial layer is provided on the top side 19 of the highly doped substrate 12. This has the advantage that it is possible to save an epitaxy step during production. This may be advantageous for some types of power semiconductor component, at least with regard to the fabrication costs. In a rough comparison of the production outlay for a power semiconductor component between the method according to an embodiment and the fabrication of a "Cool-MOS" for a reverse voltage of approximately 600 V, the application of epitaxial layers is greatly reduced, in particular the number of photoplanes that require a considerable outlay in respect of production and time is significantly reduced.

Figure 12:
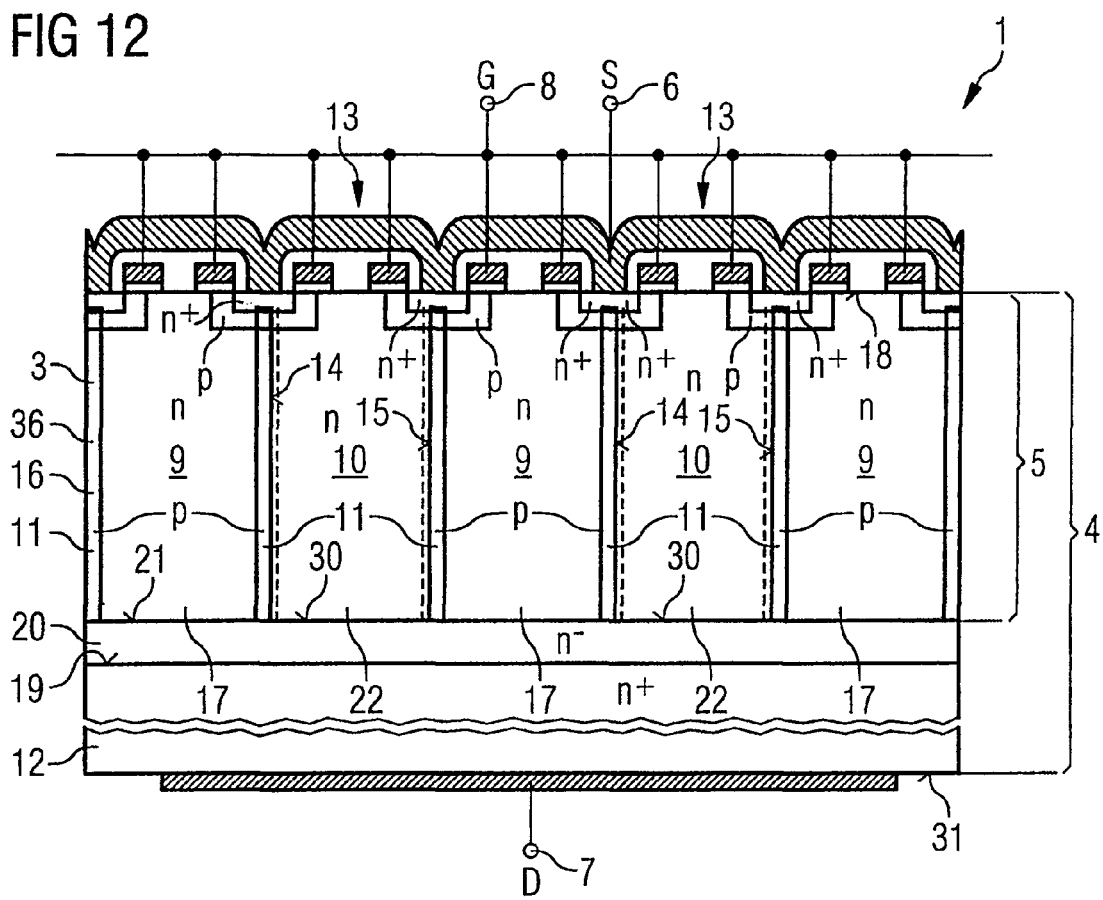

FIG. 12 shows a schematic cross section through a power semiconductor component 1 in accordance with FIG. 1. Components having functions identical to those in FIG. 1 are identified by the same reference symbols and are not discussed separately. A difference with respect to FIG. 1 is merely the broken lines 40 in the regions of the second drift zone types 10, which indicate the particular fabrication variants of the second drift zone type 10.

FIGS. 13 to 20 show schematic diagrams regarding individual method steps in the fabrication of a power semiconductor component of a second embodiment.

Figure 13:
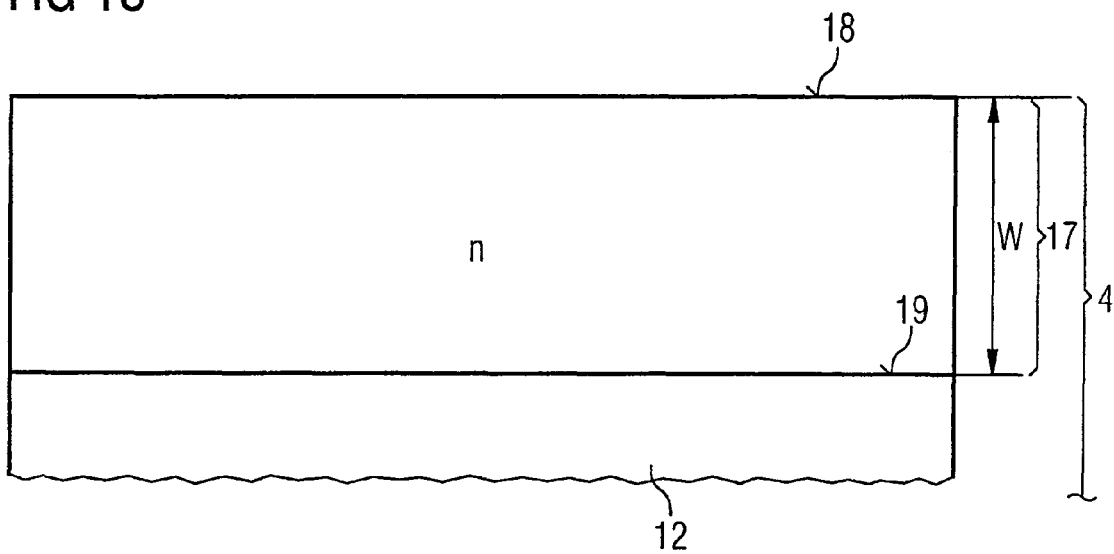
FIGS. 13 to 20 show schematic diagrams relating to individual method steps in the fabrication of a power semiconductor component of a second embodiment.

FIG. 13 shows a schematic cross section through a highly doped substrate 12 after application of an epitaxial layer 17 for a first drift cell type. The power semiconductor component of the second embodiment that is fabricated with such an epitaxial layer 17 directly on the highly doped semiconductor substrate 12 differs from the power semiconductor component of the first embodiment in that no pedestal epitaxial layer is provided. If the pedestal epitaxial layer is consequently dispensed with, as in the second embodiment, then the trench etching can be effected right into the highly doped substrate. The proportion of the complementarily doped regions for the charge compensation zones which is then situated in the substrate is insignificant for the charge compensation.

All that is relevant to the charge compensation is that part of the charge compensation zone which is situated in the drift path region, which is prescribed by the layer thickness W of the epitaxial layer 17. Fluctuations in the resultant trench depth during the subsequent trench etching have no influence on the charge compensation in this case, but the improvement of the forward resistance will turn out to be smaller in the case of great depth fluctuations since every second drift zone of the drift path is realized with the aid of the second drift zone type and then reaches right into the substrate.

Figure 14:
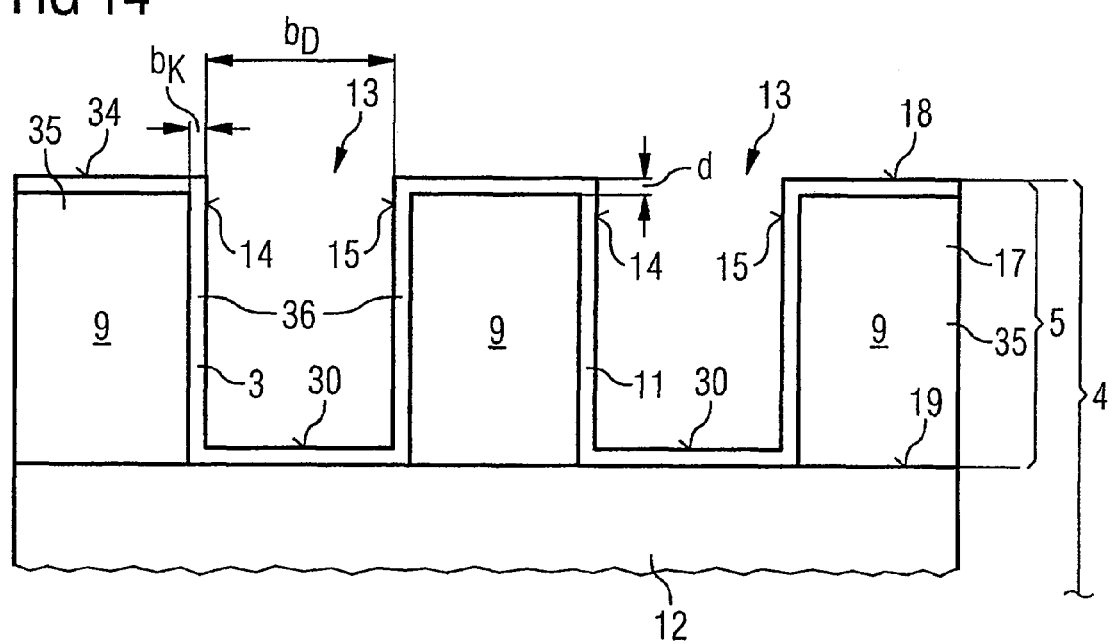

FIG. 14 shows a schematic cross section through the substrate 12 in accordance with FIG. 13, after introduction of a trench structure 13 and application of a highly doped, complementarily conducting layer 36 for charge compensation zones 11 in the trench structure walls 14 and 15. The different variants for producing such a complementarily conducting layer 36 have already been discussed in detail above in the fabrication of the first embodiment, which will therefore not be repeated here.

Figure 15:
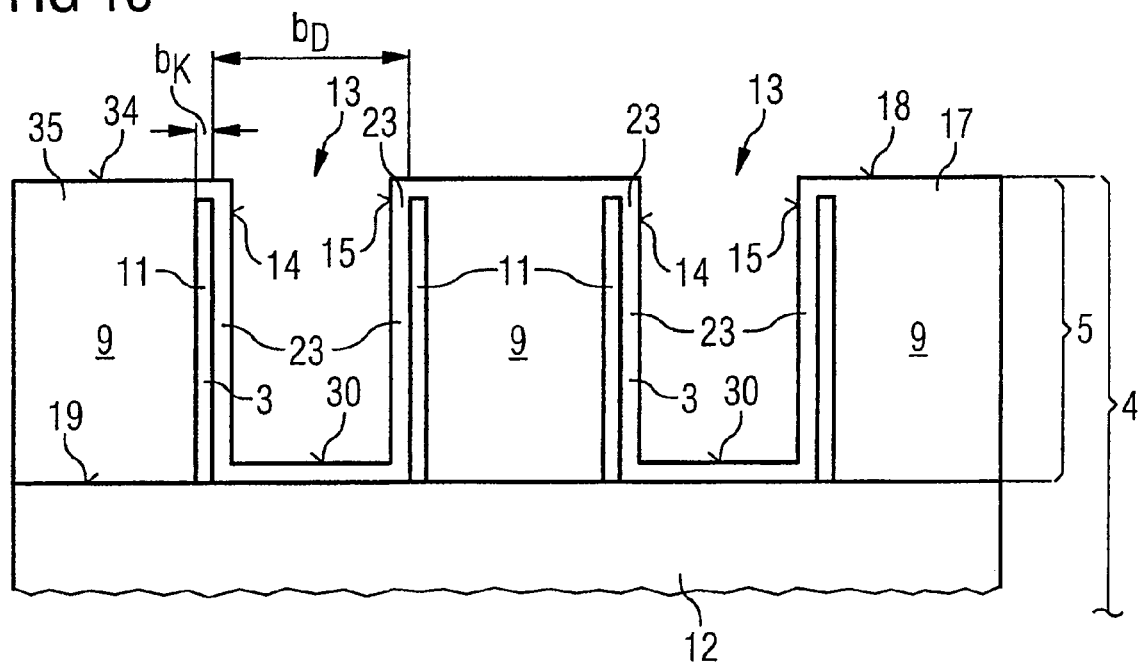

FIG. 15 shows a schematic cross section through the substrate 12 in accordance with FIG. 14, after application of a diffusion-inhibiting layer 23 in the trench structure 13. Before this diffusion-inhibiting layer 23 is applied, however, both the bottom region of the trench structure 13 and the top side 34 of the mesas 35 have been freed of the complementarily and highly conducting layer 36.

Depending on the material from which the diffusion-inhibiting layer 23 is constructed, this layer may remain on the top sides 34, and is removed selectively by means of an anisotropic etching in the bottom region 30 in order to ensure that monocrystalline material is available as a seed area for the growth of the second drift zone type. In this embodiment, the diffusion-inhibiting layer 23 used is an $Si_xGe_yC_z$ grown in monocrystalline fashion, where $x>y$ and $x>z$, and the composition preferably comprises $Si_{0.86}Ge_{0.07}C_{0.07}$. In this case, the larger germanium atom in the silicon lattice provides for a local expansion and the carbon atom provides for a local compression, so that, with a balanced number of germanium and carbon atoms in the silicon lattice, the lattice distortions are cancelled out and do not impede a monocrystalline growth of silicon in the trench structures 13.

Figure 16:
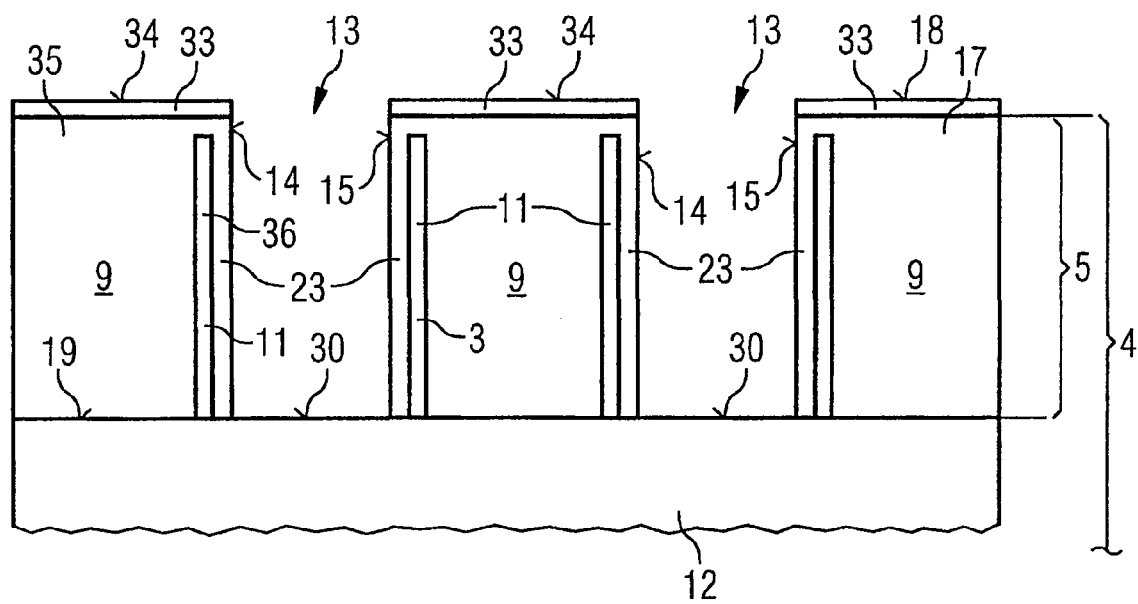

FIG. 16 shows a schematic cross section through the substrate 12 in accordance with FIG. 15, after application of an end point control layer 33 on the top sides 34 of the mesas 35 and after uncovering the trench bottom 30. This provides a precondition for a reliable monocrystalline growth of a drift zone of a second drift zone type, especially as the bottom region 30 is completely free of diffusion-inhibiting layers. What is achieved at the same time by the end point control layer 33 on the top side 34 of the mesas 35 of the first drift zone type 9 is that after the filling of the trench structure 13, an etching-back of the surface 18 of the semiconductor body 4 is signalled by the end point control layer 33.

Figure 17:
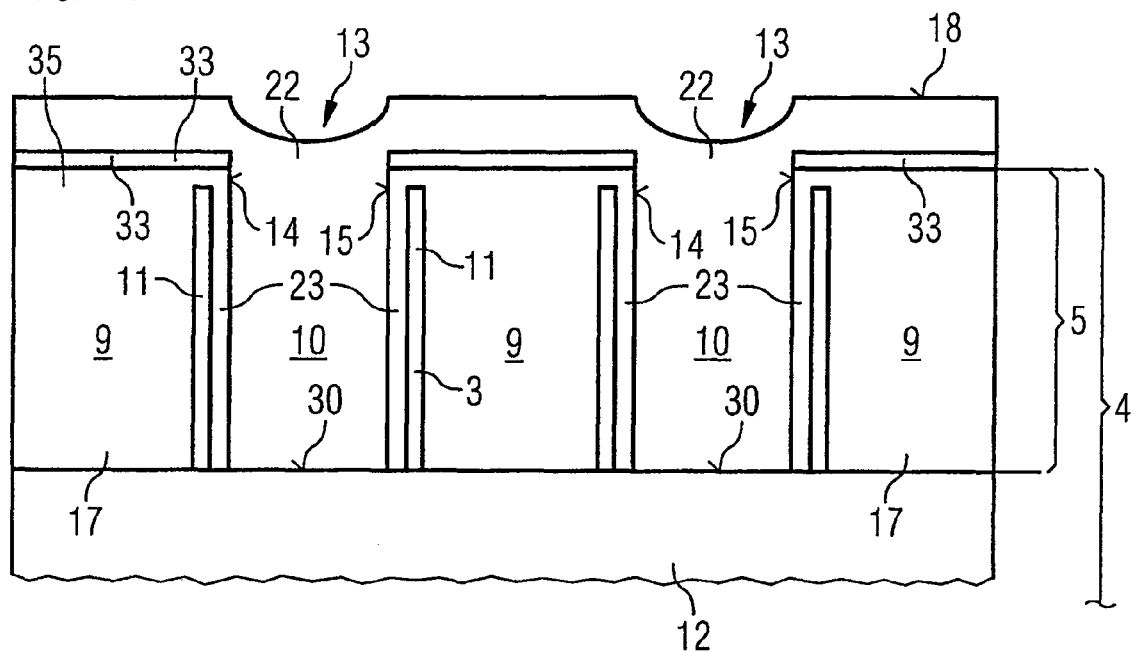

FIG. 17 shows a schematic cross section through the substrate 12 in accordance with FIG. 16, after growth of a monocrystalline semiconductor material in the trench structures 13 for a second drift zone type 10. Components having functions identical to those in the previous figures are identified by the same reference symbols and are not discussed separately. The particular feature with regard to this monocrystalline growth from the bottom region 30 of the trench structure 13 is that the sidewalls have a diffusion-inhibiting layer 23, which is likewise constructed in monocrystalline fashion in terms of its basic structure, but as substitutional atoms carbon and germanium in a proportion of up to 0.07, that is to say up to 7 atoms of germanium and 7 atoms of carbon up to 86 atoms of silicon, form the lattice.

As already mentioned above, the lattice distortions caused by these atoms having a different size relative to the silicon atoms are cancelled out to an extent such that the monocrystalline growth from the bottom region 30 of the trench is not significantly impaired by the side edges. For this purpose, however, it is also useful, as is effected here, for the bottom region 30 to be completely freed of a diffusion-inhibiting coating by means of anisotropic etching. However, other materials for the diffusion-inhibiting coating 23, such as a cap layer made of amorphous silicon or a layer made of silicon carbide, may also be deposited as a diffusion-inhibiting layer on the trench structure walls, but these diffusion-inhibiting layers may cause lattice dislocations and other crystal defects in the semiconductor material 22 growing in monocrystalline fashion in the trench structure 13.

The use of different materials for the end point control layer is less critical, especially as the semiconductor material forming above it is etched back as far as the end point control layer 33 and also beyond it in a next method step. Since the top side 18 of the semiconductor body 4 is relatively uneven after the filling of the trenches with monocrystalline semiconductor material and does not appear to be suitable for the application of the required top side structures for the different types of power semiconductor component, firstly the top side 18 is leveled with a corresponding resist layer or planarization layer and is subsequently, as already mentioned above, then etched back uniformly, as shown in FIG. 18.

Figure 18:
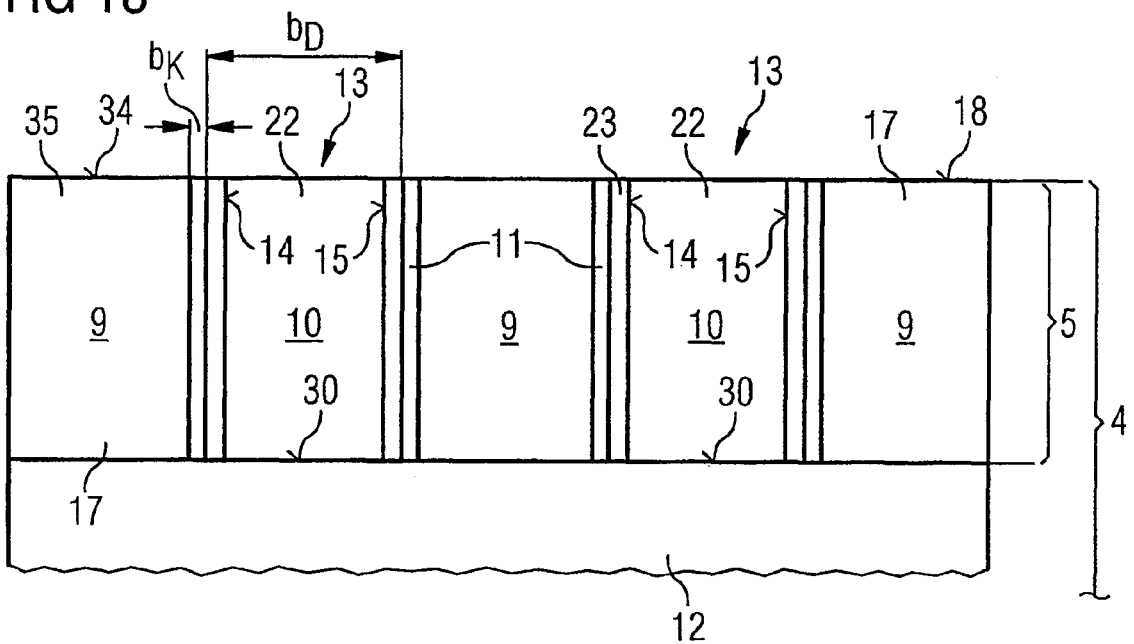

FIG. 18 shows a schematic cross section through the substrate 12 in accordance with FIG. 17, after etching back the top side 18 of the semiconductor body 4. After etching back the surface 18 of the semiconductor body 4, diffusion zones of the first and second diffusion zone types 9 and 10, respectively, now lie in a manner arranged alternately alongside one another, the diffusion zone type 9 differing from the diffusion zone type 10 by virtue of the fact that the walls 14 and 15 forming charge compensation zones additionally have a diffusion-inhibiting layer 23, which the diffusion zone type 9 does not have.

Figure 19:
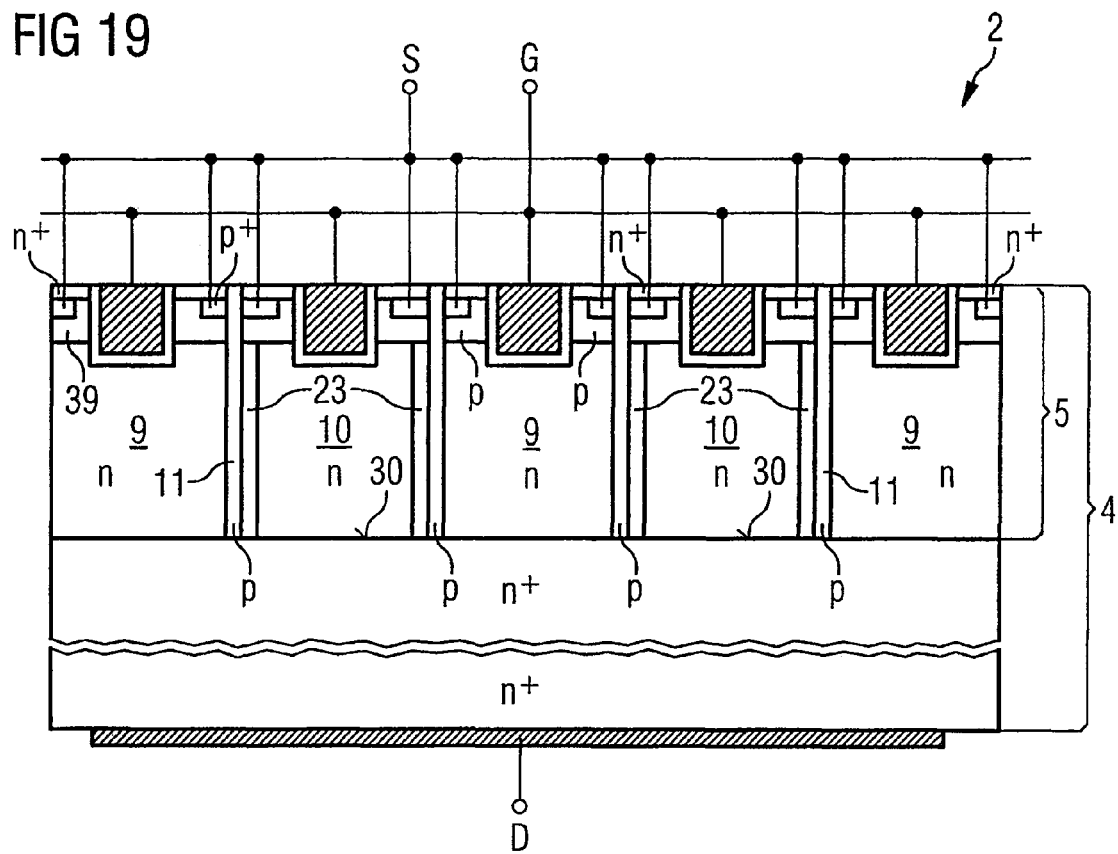

FIG. 19 shows a schematic cross section through a power semiconductor component 2 of a second embodiment. For this purpose, further top side structures and rear side structures have been introduced in and/or on the semiconductor body 4 for completion, the second embodiment differing from the first embodiment in accordance with FIG. 1 by virtue of the fact that the gate structure for the gate electrode G is also realized in a trench structure, the trench depth for the gate structure being only slightly larger than the penetration depth of the weakly complementarily conducting body zone 39.

FIGS. 20 to 26 show schematic cross sections through the edge region 38 of a power semiconductor component in the fabrication of an edge structure 24. An edge termination for a component according to FIG. 1 is shown schematically. It goes without saying that such an edge termination can also be realized for components according to FIG. 19.

Figure 20:
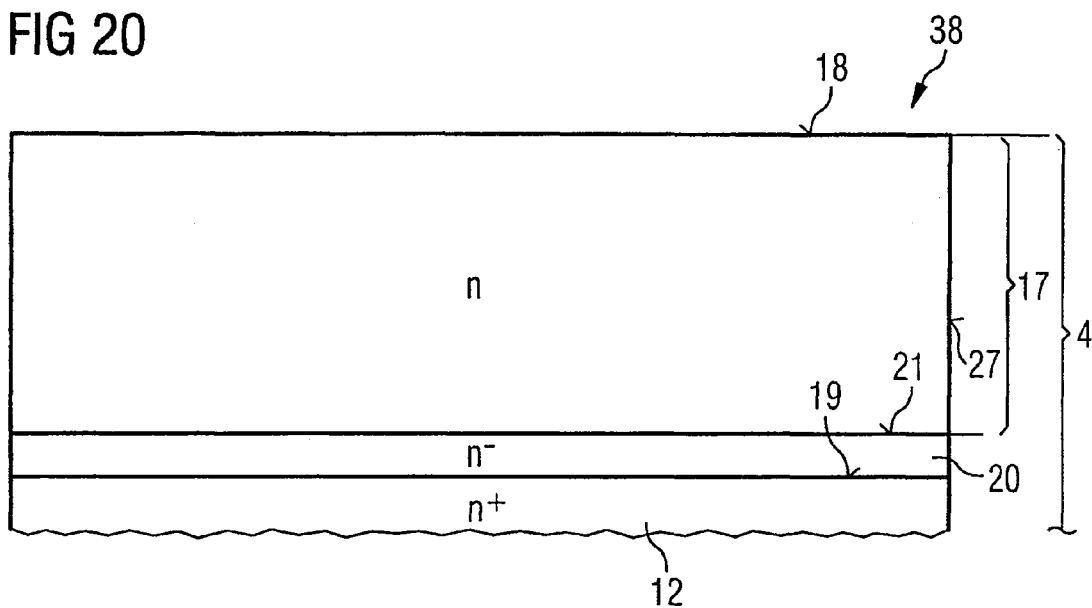

FIG. 20 shows a schematic cross section through the edge region 38 of the power semiconductor component 1 with substrate 12, with pedestal epitaxial layer 19 and epitaxial layer 17, into which the trench structure is to be introduced. This corresponds to the illustrations in FIGS. 2 and 13 and represents, then, the edge 27 of the power semiconductor component. This edge 27 is provided with an edge trench 25.

Figure 21:
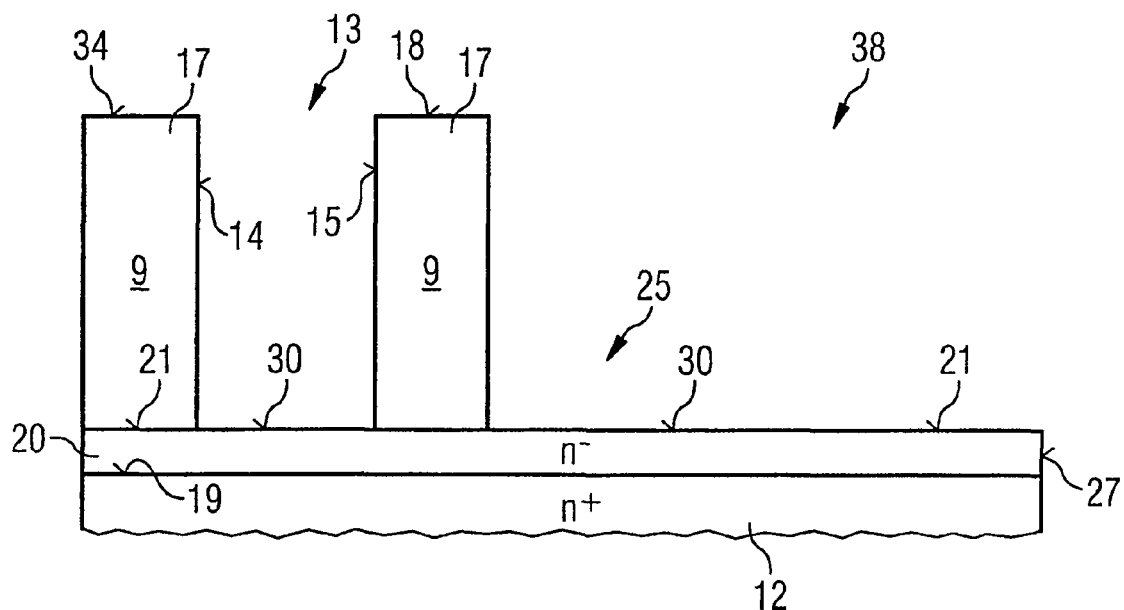

FIG. 21 shows a schematic cross section through the edge region 38 in accordance with FIG. 20, after introduction of a trench structure 13 with an edge trench 25. The edge trench 25 is introduced just like the trench structure 13 as far as the bottom region 30 on the top side 21 of the pedestal epitaxial layer 20 by means of selective anisotropic etching. In this respect, the formation of a specific edge structure for components of this type does not require special production steps.

Figure 22:
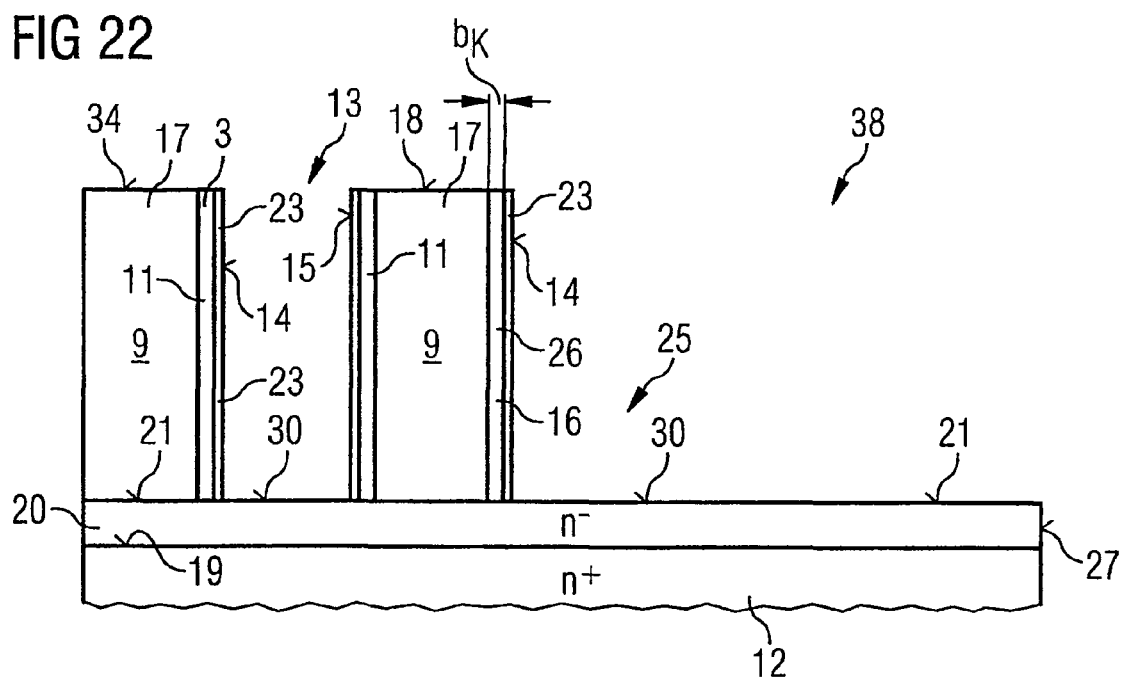

FIG. 22 shows a schematic cross section through the edge region 38 in accordance with FIG. 21, after introduction of a complementarily conducting layer 16 into the trench walls 14 and 15, and of a diffusion-inhibiting layer 23 onto the trench walls 14 and 15. This ensures that an outdiffusion from the complementarily conducting trench walls 14 and 15 into the material growing in monocrystalline fashion in the trench structure 13 and in the edge trench 25 is impeded.

Figure 23:
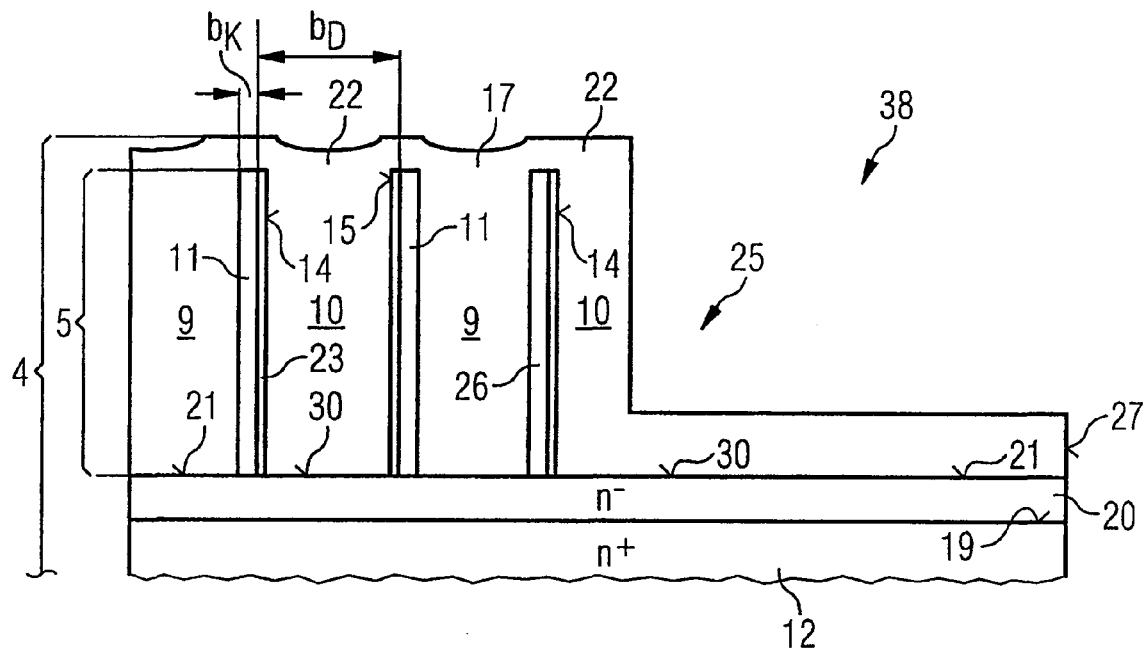

FIG. 23 shows a schematic cross section through the edge region 38 of FIG. 22, after filling the trench structure with monocrystalline semiconductor material 22 for a second drift zone type 10 and simultaneously filling the edge trench 25. Since the etching-back may indeed be effected wet-chemically and isotropically, it is possible to utilize the etching-back step to achieve a curved edge contour in the filled edge trench 25.

Figure 24:
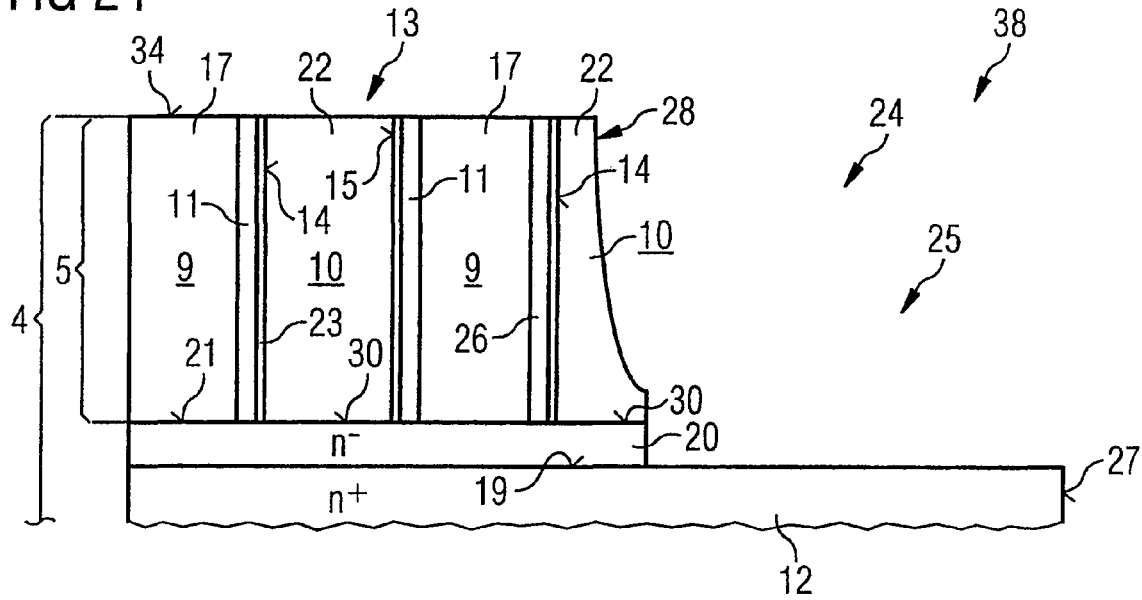

FIG. 24 shows a schematic cross section through the edge region 38 in accordance with FIG. 23, after etching back the top side 18 of the semiconductor body 4 and uncovering an edge contour 28 in the edge trench 25. In order to ensure that the edge contour 24 reaches right into the highly doped substrate 12, a further etching step is required, which cannot be carried out at the same time as the trench structure etching since the pedestal epitaxial layer 20 has to be removed for the edge structure 24. After this additional etching step down to the top side 19 of the highly doped substrate 12, an edge contour 28 is available which, in interaction with the edge compensation zone 26, which may be floating, is prepared in such a way that the edge contour 28 can now be passivated.

Figure 25:
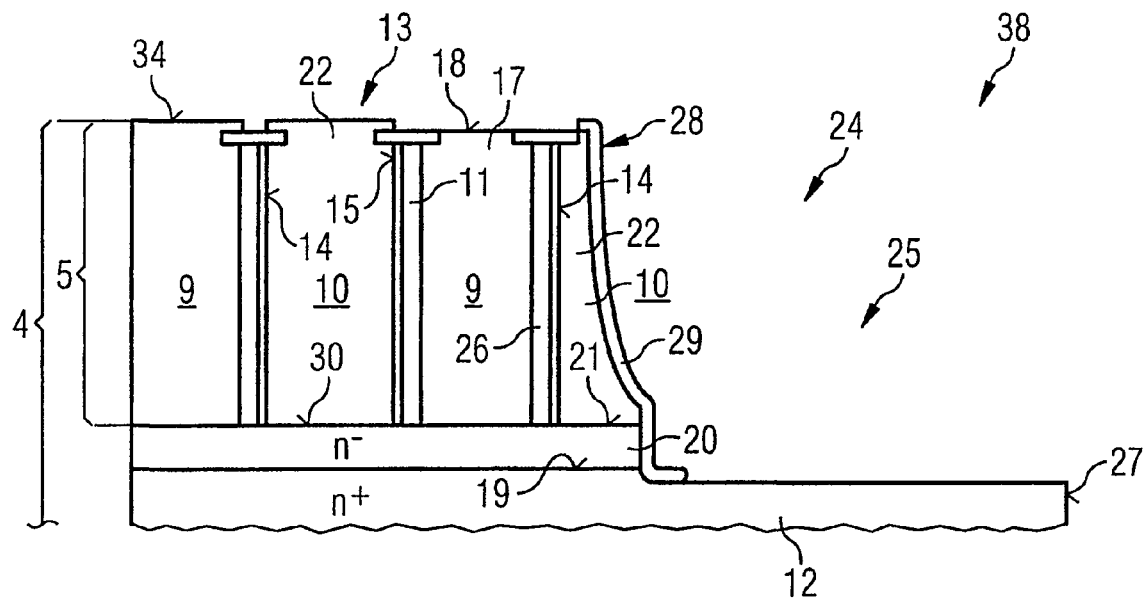

FIG. 25 shows a schematic cross section through the edge region 38 in accordance with FIG. 24, after application of an edge passivation layer 29. This edge passivation layer 29 ensures, then, that no creepage currents in the edge region influence the properties of the power semiconductor component. Said edge passivation layer 29 may have a semiconductor oxide, a semiconductor nitride, a diamondlike carbon, a silicon carbide, or, if such passivation layers also have to be effected on the power semiconductor component, these can be used to form the edge passivation layer as well. Thus, if polyimide layers are required for the power semiconductor component, said polyimide layers can also be used for said passivation.

Figure 26:
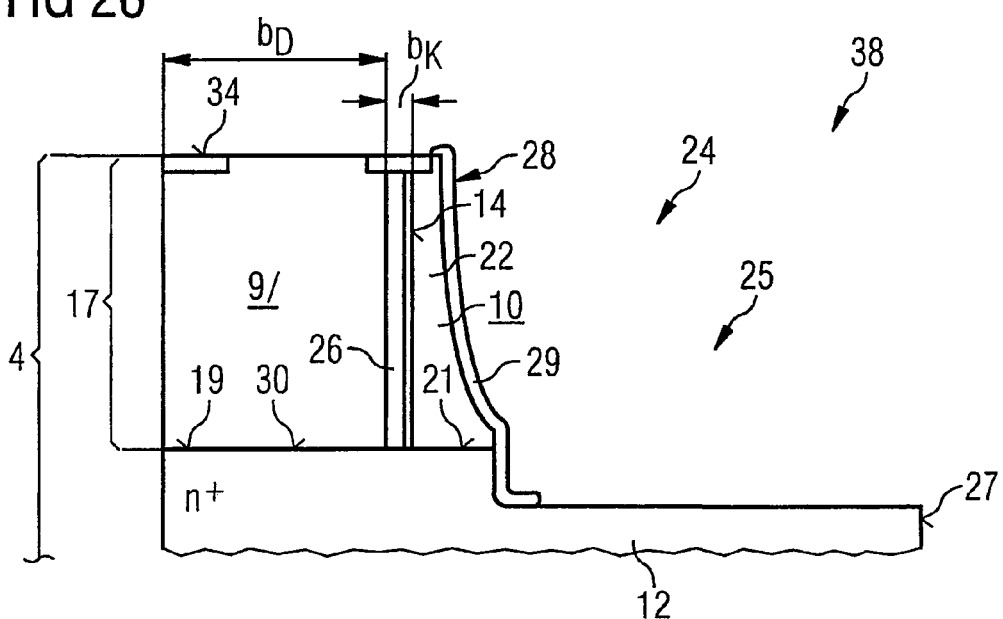

FIG. 26 shows a schematic cross section through an alternative edge structure 24. The latter differs from the edge structure in accordance with FIG. 25 by virtue of the fact that no pedestal epitaxial layer is provided. Moreover, this edge structure 24 is also suitable for lateral high-voltage semiconductor elements which do not necessarily operate according to the compensation principle. In the case of these elements, a deep trench is produced in the edge region, as shown in FIG. 26, which trench preferably reaches approximately as deep or somewhat deeper than the space charge zone does later.

A complementarily conducting doping is subsequently introduced at the trench surface, which may be produced either by means of implantation or indiffusion, or by epitaxial growth. A layer of the first conduction type is then deposited epitaxially over this complementarily doped layer. As an alternative, this doping may also be effected by means of an implantation or precoating with subsequent indiffusion. For this purpose, the complementarily conducting region should be electrically connected to a low potential, such as the source potential. The doping of the epitaxial layer grown in the edge trench is chosen analogously to a compensation component and is thus significantly higher than the doping of the drift zone or of the base zone in the active component region.

The dimensionings and patterning of the epitaxial layer also apply to the edge region; in particular, there must be sufficiently good compensation of layers provided complementarily and with first conduction types in the edge in which case the breakdown charge of the respective n-conducting and p-conducting regions should not be exceeded in the lateral direction. By virtue of an increased concentration of the first conduction type in the edge region, the sensitivity to surface charges is reduced and, consequently, the requirements made of the passivation are less stringent. On the other hand, by dispensing with a proton implantation in the edge region it is possible to provide for improving the overvoltage protection in the edge region with respect to the reverse voltage magnitude in the drift path region.

LIST OF REFERENCE SYMBOLS

1 Power semiconductor component (1st embodiment)
2 Power semiconductor component (2nd embodiment)
3 Charge compensation structure
4 Semiconductor body
5 Drift path
6 Source electrode
7 Drain electrode
8 Gate electrode
9 Drift zone, 1st drift zone type
10 Drift zone, 2nd drift zone type
11 Charge compensation zone
12 Monocrystalline substrate
13 Trench structure
14 Wall of the trench structure
15 Wall of the trench structure
16 Complementarily conducting layer on trench structure walls
17 Medium-doped epitaxial layer
18 Top side of the semiconductor body
19 Top side of the substrate
20 Pedestal epitaxial layer
21 Top side of the pedestal epitaxial layer
22 Filled monocrystalline semiconductor material
23 Diffusion-inhibiting layer
24 Edge structure
25 Edge trench
26 Edge compensation zone
27 Edge of the power semiconductor component
28 Edge contour
29 Edge passivation layer
30 Bottom region of the trench structure
31 Rear side of the semiconductor body
32 Patterned auxiliary layer
33 End point control layer
34 Top side of the mesas
35 Mesas
36 Highly doped monocrystalline epitaxial layer on trench structure wall
37 Leveling photoresist layer
38 Edge region
39 p-conducting body zone
40 Broken line
D Drain electrode
G Gate electrode
S Source electrode
h Height of the mesas
t Trench depth
W Layer thickness of the epitaxy

What is claimed is:

1. A semiconductor component with charge compensation structure, comprising, in a semiconductor body, a drift path between two electrodes, and the drift path having drift zones of a first conduction type, which provide a current path between the electrodes in the drift path, and charge compensation zones of a complementary conduction type, which constrict the current path of the drift path, the drift zones comprising two alternately arranged, epitaxially grown drift zone types of the first conduction type, a first drift zone type having monocrystalline semiconductor material on a monocrystalline substrate, and a second drift zone type having monocrystalline semiconductor material in a trench structure with complementarily doped walls, the complementarily doped walls forming the charge compensation zones, wherein the ratio v between the width $b_K$ of the charge compensation zones transversely with respect to the current path and the width $b_D$ of the drift zones transversely with respect to the current path is $b_K/b_D = v \leqq 0.1$.

2. A semiconductor component according to claim 1, wherein the width of the charge compensation zones is defined by the penetration depth of a dopant of the complementary conduction type into drift zone material of the first drift zone type, the penetration depth being arranged in wall regions of trench structures which are filled epitaxially with monocrystalline semiconductor material of the first conduction type and extend in the current path direction.

3. A semiconductor component according to claim 1, wherein the width of the charge compensation zones is defined by an epitaxial growth thickness of a monocrystalline semiconductor material layer of the complementary conduction type which is arranged on wall regions of trench structures which are filled epitaxially with monocrystalline semiconductor material of the first conduction type and extend in the current path direction.

4. A semiconductor component according to claim 1, wherein the charge compensation zones and the drift zones are arranged in strip-type fashion alongside one another between the electrodes.

5. A semiconductor component according to claim 4, wherein a respective strip-type drift zone is delimited in terms of its width transversely with respect to the current path by two strip-type charge compensation zones in the current path direction.

6. A semiconductor component according to claim 1, wherein the semiconductor body has a highly doped substrate of the first or of the complementary conduction type, on which is arranged a weakly doped to medium-doped epitaxial layer of the first conduction type with the drift path.

7. A semiconductor component according to claim 6, wherein the charge compensation zones extend in terms of their depth from a top side of the semiconductor body as far as a top side of the substrate.

8. A semiconductor component according to claim 1, wherein the semiconductor body has a nonpatterned weakly doped pedestal epitaxial layer of the first conduction type between the drift path and the substrate.

9. A semiconductor component according to claim 8, wherein the charge compensation zones extend in terms of their depth from a top side of the semiconductor body as far as a top side of the pedestal epitaxial layer.

10. A semiconductor component according to claim 1, wherein the semiconductor component has, in the region of the drift path transversely with respect to the current direction, a layer of the first conduction type which is doped by means of proton implantation and is doped more highly than the surrounding drift zones and has, in the region of the charge compensation zones, a reduced net dopant concentration of the complementary conduction type.

11. A semiconductor component according to claim 1, wherein the first and/or the second drift zone type have a monocrystalline semiconductor material of the first conduction type, in which impurity atoms are arranged to reduce the diffusion coefficient of the complementarily doping defects.

12. A semiconductor component according to claim 1, wherein the second drift zone type has a monocrystalline semiconductor material of the first conduction type in the trench structure provided with complementarily doped walls, an arranged carbon dopant concentration [C] up to $[C] \leq 1 \times 10^{20}$ cm$^{-3}$.

13. A semiconductor component according to claim 1, wherein the second drift zone type has a monocrystalline semiconductor material of the first conduction type in the trench structure provided with complementarily doped walls, the trench structure not being completely filled and having a termination filling of an insulation material in the upper region of the trenches.

14. A semiconductor component according to claim 13, wherein the termination filling comprises an SiO$_2$ termination filling.

15. A semiconductor component according to claim 13, wherein germanium and carbon are arranged substitutionally on silicon crystal lattice sites.

16. A semiconductor component according to claim 1, wherein the complementarily doped walls of the trench structure have, toward the filling monocrystalline semiconductor material of the second drift zone type, a diffusion-inhibiting monocrystalline layer with Si$_x$Ge$_y$C$_z$, where x>y and x>z.

17. A semiconductor component according to claim 16, wherein Si$_x$Ge$_y$C$_z$ comprises Si$_{0.86}$Ge$_{0.07}$C$_{0.07}$.

18. A semiconductor component according to claim 1, wherein a diffusion-inhibiting layer is provided between the complementarily doped walls of the trench structure and the filling monocrystalline semiconductor material of the second drift zone type, said diffusion-inhibiting layer being arranged in the complementarily doped walls and/or in the filling semiconductor material.

19. A semiconductor component according to claim 18, wherein amorphous silicon or silicon carbide, in particular cubic silicon carbide, or silicon germanium being provided as the diffusion-inhibiting layer.

20. A semiconductor component according to claim 1, wherein the semiconductor component has an edge structure with at least one edge trench as edge termination.

21. A semiconductor component according to claim 20, wherein the edge structure has at least one complementarily doped edge compensation zone of a trench wall of the edge trench along the edge of the semiconductor component, the adjoining trench having, toward the edge of the semiconductor component, semiconductor material grown in monocrystalline fashion.

22. A semiconductor component according to claim 21, wherein the complementarily doped edge compensation zone is floating.

23. A semiconductor component according to claim 21, wherein the edge structure has an edge contour toward the edge of the semiconductor component, which edge contour, through isotropic and/or anisotropic etching of the epitaxial layer grown in the edge trench, has a curved contour that extends from the top side of the semiconductor body preferably right into the substrate in the region of the monocrystalline semiconductor material, an edge passivation layer adapted to the edge contour being arranged on the semiconductor layer.

24. A semiconductor component according to claim 23, wherein the edge passivation layer has a semiconductor oxide, a semiconductor nitride, a DLC, a thermally grown oxide and/or a silicon carbide.

25. A semiconductor component according to claim 20, wherein a semiconductor component without a charge compensation zone in a drift path has the edge structure with edge trench, edge compensation zone, and edge contour passivation.

26. A semiconductor component according to claim 25, wherein the edge compensation zone is floating.

27. A semiconductor component according to claim 1, wherein the semiconductor component is a power semiconductor component.

28. A semiconductor component with charge compensation structure, comprising:
a drift path between two electrodes, wherein the drift path has drift zones of a first conduction type and charge compensation zones of a complementary conduction type, and wherein the drift zones comprise two alternately arranged, epitaxially grown drift zone types of the first conduction type,
a first drift zone type comprising monocrystalline semiconductor material on a monocrystalline substrate, and a second drift zone type comprising monocrystalline semiconductor material in a trench structure with complementarily doped walls, the complementarily doped walls forming the charge compensation zones,
wherein the ratio v between the width $b_K$ of the charge compensation zones transversely with respect to the current path and the width $b_D$ of the drift zones transversely with respect to the current path is $b_K/b_D = v \leq 0.1$.

29. A semiconductor component according to claim 28, wherein the semiconductor component is a power semiconductor component.

* * * * *